US012652015B2

(12) United States Patent
Inoue et al.

(10) Patent No.: US 12,652,015 B2
(45) Date of Patent: Jun. 9, 2026

(54) ACOUSTIC WAVE DEVICE

(71) Applicant: Murata Manufacturing Co., Ltd., Nagaokakyo (JP)

(72) Inventors: Kazunori Inoue, Nagaokakyo (JP); Yuta Ishii, Nagaokakyo (JP); Munehisa Watanabe, Nagaokakyo (JP); Ventsislav Yantchev, Sofia (BG); Patrick Turner, Portola Valley, CA (US); Bryant Garcia, Mississauga (CA)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 330 days.

(21) Appl. No.: 18/358,281

(22) Filed: Jul. 25, 2023

(65) Prior Publication Data

US 2023/0370041 A1     Nov. 16, 2023

Related U.S. Application Data

(63) Continuation of application No. PCT/US2022/013520, filed on Jan. 24, 2022.
(Continued)

(51) Int. Cl.
 *H03H 9/02* (2006.01)
 *H03H 9/13* (2006.01)
 (Continued)

(52) U.S. Cl.
 CPC .... *H03H 9/02055* (2013.01); *H03H 9/02031* (2013.01); *H03H 9/133* (2013.01); *H03H 9/173* (2013.01); *H03H 9/568* (2013.01)

(58) Field of Classification Search
 CPC ........... H03H 9/02055; H03H 9/02031; H03H 9/133; H03H 9/173; H03H 9/568;
 (Continued)

(56) References Cited

U.S. PATENT DOCUMENTS

| 5,329,208 A | 7/1994 | Imai et al. |
| 5,708,402 A | 1/1998 | Hachisu et al. |
(Continued)

FOREIGN PATENT DOCUMENTS

| JP | 2002330047 A | 11/2002 |
| JP | 2012257019 A | 12/2012 |

OTHER PUBLICATIONS

International Search Report in PCT/US2022/013520, mailed Apr. 22, 2022, 3 pages.

*Primary Examiner* — Jorge L Salazar, Jr.
(74) *Attorney, Agent, or Firm* — ArentFox Schiff LLP

(57) ABSTRACT

An acoustic wave device is provided that includes a support substrate, a piezoelectric layer on the support substrate, a first electrode and a second electrode on the piezoelectric layer in a lamination direction of the support substrate and the piezoelectric layer, the first and the second electrodes are opposed in a first direction that intersects with the lamination direction; and a space that defines either a cavity in a portion of the support substrate or an air gap between the support substrate and the piezoelectric layer. A portion of each of the first and the second electrodes overlaps the space in a plan view in the lamination direction. A first roughness of a major surface of the support substrate, opposite from the piezoelectric layer, is greater than a second roughness of a major surface of the piezoelectric layer on which the first and second electrodes are located.

20 Claims, 17 Drawing Sheets

Related U.S. Application Data

(60) Provisional application No. 63/141,006, filed on Jan. 25, 2021.

(51) Int. Cl.
*H03H 9/17*            (2006.01)
*H03H 9/56*            (2006.01)

(58) Field of Classification Search
CPC ........... H03H 9/02015; H03H 9/02118; H03H 9/174; H03H 9/175; H03H 9/02228
USPC ......................................... 333/133, 193–196
See application file for complete search history.

(56)            References Cited

U.S. PATENT DOCUMENTS

| | | | |
|---|---|---|---|
| 2017/0363584 A1 | 12/2017 | Tong et al. | |
| 2019/0386637 A1* | 12/2019 | Plesski | H03H 9/02015 |
| 2020/0259480 A1 | 8/2020 | Pensala et al. | |
| 2021/0351762 A1* | 11/2021 | Dyer | H03H 9/13 |
| 2021/0399709 A1* | 12/2021 | Yamamoto | H03H 9/02102 |
| 2022/0123711 A1* | 4/2022 | Taniguchi | H03H 9/02574 |

* cited by examiner

FREQUENCY (GHz)

FRACTIONAL BAND WIDTH

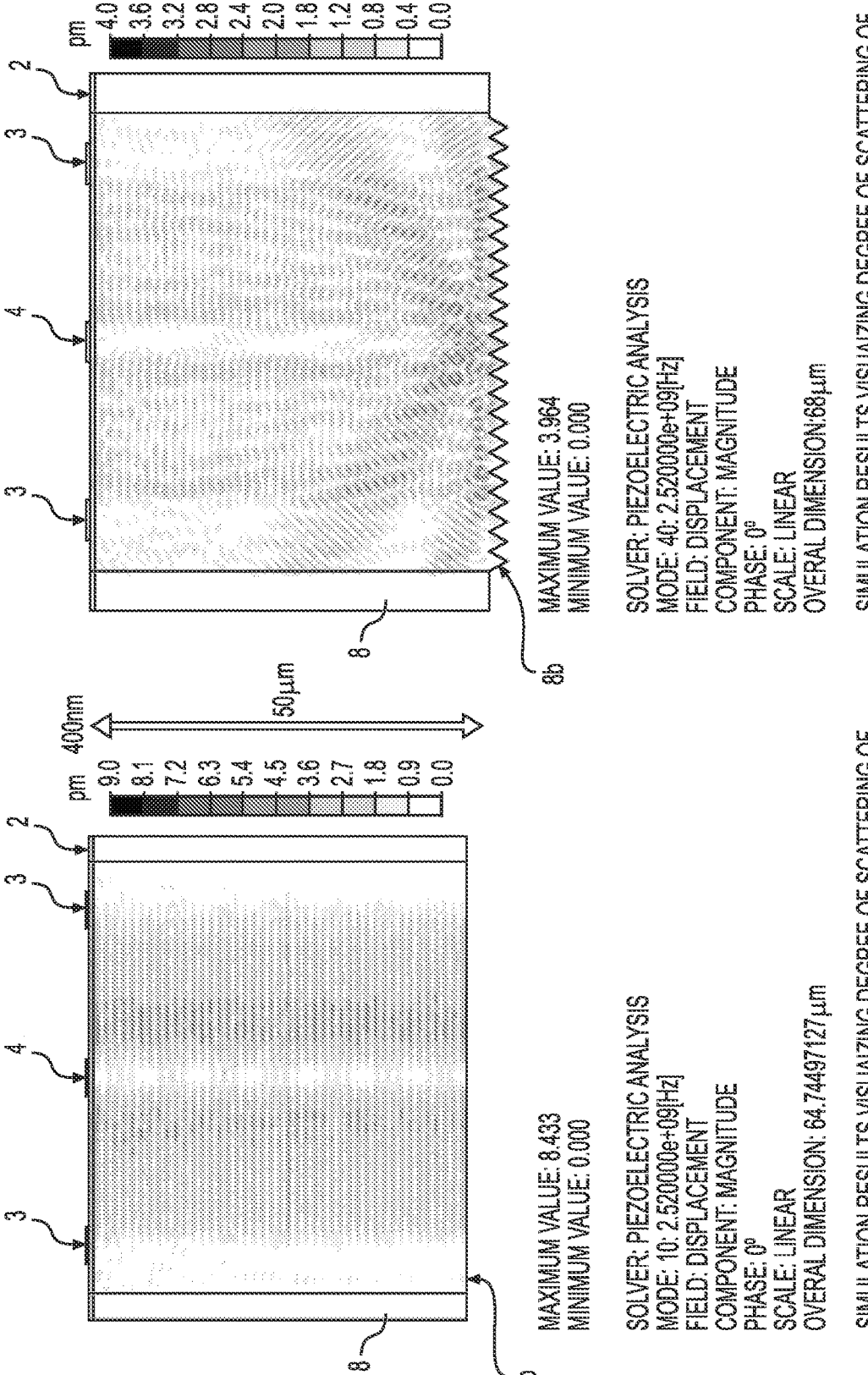

MAXIMUM VALUE: 3.964
MINIMUM VALUE: 0.000

SOLVER: PIEZOELECTRIC ANALYSIS
MODE: 40: 2.520000e+09[Hz]
FIELD: DISPLACEMENT
COMPONENT: MAGNITUDE
PHASE: 0°
SCALE: LINEAR
OVERALL DIMENSION:68μm

SIMULATION RESULTS VISUALIZING DEGREE OF SCATTERING OF
VIBRATIONS WITH PERIODICAL ROUGHNESS

*FIG. 23*

MAXIMUM VALUE: 8.433
MINIMUM VALUE: 0.000

SOLVER: PIEZOELECTRIC ANALYSIS
MODE: 10: 2.520000e+09[Hz]
FIELD: DISPLACEMENT
COMPONENT: MAGNITUDE
PHASE: 0°
SCALE: LINEAR
OVERALL DIMENSION: 64.7449127μm

SIMULATION RESULTS VISUALIZING DEGREE OF SCATTERING OF
VIBRATIONS WITH PERIODICAL ROUGHNESS

*FIG. 22*

ACOUSTIC WAVE DEVICE

CROSS REFERENCE TO RELATED APPLICATIONS

This application is a continuation of PCT/US2022/013520, filed Jan. 24, 2022, which claims priority to U.S. Provisional Application No. 63/141,006 filed on Jan. 25, 2021, the entire contents of each application of which are hereby incorporated by reference.

TECHNICAL FIELD

The present invention relates to acoustic wave devices each including a piezoelectric layer of lithium niobate or lithium tantalate.

BACKGROUND

Filter characteristics of acoustic wave devices can deteriorate due to an occurrence of ripple. For example, FIG. 14 shows an acoustic wave device 101 of the related art that includes a support substrate 108, a cavity 109 in the support substrate 108, a piezoelectric layer 102 laminated on the support substrate 108 over the cavity 109, and first and second resonators 110, 120. Each of the first and the second resonators 110, 120 includes first and second electrodes 103, 104. As shown in FIG. 14, the first and the second electrodes 103, 104 can partially overlap with a corresponding cavity 109, such that each of the first and the second electrodes 103, 104 includes a non-overlapping region 130 in which the first and the second electrodes 103, 104 do not overlap (in the thickness or vertical direction) with the corresponding cavity 109. When a potential difference is applied to the first and the second electrodes 103, 104, a leakage wave 140 of a wave excited by one of the first and the second electrodes 103, 104 reflects on the support substrate 108 and propagates to the other of the second and the first electrodes 104, 103. FIG. 15 shows the pass band of the acoustic wave device 101 of FIG. 14, and FIG. 16 is close-up view of the portion of the pass band circled with a broken line in FIG. 16. As shown in FIGS. 15 and 16, a large amount of ripple can occur in the pass band of a filter including the acoustic wave device 101, resulting in deteriorated filter characteristics.

SUMMARY OF THE INVENTION

As described herein, exemplary embodiments of the present invention provide for acoustic wave devices that each include a support substrate including a bottom surface that is rougher than a major surface of a piezoelectric layer on which electrodes are provided. The rougher bottom surface scatters reflected vibrations, reducing propagation of reflected vibrations to regions of the piezoelectric layer where electrodes do not overlap with cavities, and reducing a reflected wave received by the electrodes having different potentials, resulting in attenuated ripple.

Thus, according to an exemplary embodiment, an acoustic wave device is provided that includes a support substrate; a piezoelectric layer on the support substrate; a first electrode and a second electrode on the piezoelectric layer in a lamination direction of the support substrate and the piezoelectric layer, the first and the second electrodes are opposed in a first direction that intersects with the lamination direction; and a space defining either a cavity in a portion of the support substrate or an air gap between the support substrate and the piezoelectric layer. Moreover, at least a portion of each of the first and the second electrodes overlaps the space in a plan view in the lamination direction. A first roughness of a major surface of the support substrate, opposite from the piezoelectric layer, is greater than a second roughness of a major surface of the piezoelectric layer on which the first and second electrodes are located.

According to another exemplary embodiment, an acoustic wave device is provided that includes a support substrate; a piezoelectric layer on the support substrate in a first direction of the support substrate; an acoustic reflection layer including, between the support substrate and the piezoelectric layer, one or more low acoustic impedance layers and one or more high acoustic impedance layers; and a first electrode and a second electrode on the piezoelectric layer in a lamination direction of the support substrate and the piezoelectric layer, the first and the second electrodes are opposed in a first direction that intersects with the lamination direction. Moreover, at least a portion of each of the first and the second electrodes overlaps the acoustic reflection layer in a plan view in the lamination direction. In this aspect, a first roughness of a major surface of the support substrate, opposite from the piezoelectric layer, is greater than a second roughness of a major surface of the piezoelectric layer on which the first and second electrodes are located.

In an exemplary aspect, the first roughness can be greater than or equal to about 2 μm in surface roughness (Ra), can be greater than or equal to about 3.5 μm in surface roughness (Ra), or can be greater than or equal to about 3.8 μm in surface roughness (Ra). The first roughness can be less than or equal to about 8.5 μm in surface roughness (Ra).

In another exemplary aspect, the major surface having the first roughness can include periodic recesses and protrusions.

In another exemplary aspect, the piezoelectric layer can include lithium niobate or lithium tantalate, and a bulk wave in a thickness-shear mode can used.

In another exemplary aspect, the piezoelectric layer can include lithium niobate or lithium tantalate, the first electrode can be included in a plurality of first electrodes arranged in the first direction, the second electrode can be included in a plurality of second electrodes arranged in the first direction, the acoustic wave device can further include a first busbar extending in the first direction and a second busbar extending in the first direction, the plurality of first electrodes can be connected to the first busbar, and the plurality of second electrodes can be connected to the second busbar. Moreover, in this aspect, $d/p \leq 0.5$, where d is a thickness of the piezoelectric layer and p is a distance between a center of the first electrode and a center of the second electrode. One second electrode of the plurality of second electrodes can be between adjacent first electrodes among the plurality of first electrodes.

In another exemplary aspect, the first electrode can be included in a plurality of first electrodes arranged in the first direction, the second electrode can be included a plurality of second electrodes arranged in the first direction, the acoustic wave device can further include a first busbar extending in the first direction and a second busbar extending in the first direction, the plurality of first electrodes can be connected to the first busbar, the plurality of second electrodes can be connected to the second busbar, and a plate wave can be used.

In another exemplary aspect, the first electrode can be included in a first resonator, and the second electrode can be included in a second resonator different from the first resonator. The first and the second resonators can be included in a ladder filter. The first resonator can be a series arm resonator, and the second resonator can be a parallel arm resonator.

Moreover, a potential difference can be applied to the first and the second electrodes.

According to another exemplary embodiment, an acoustic wave device is provided that includes a support substrate including a first surface and a second surface opposed to the first surface; a piezoelectric layer on the first surface of the support substrate and including a first surface and a second surface opposed to the first surface; and first and second resonators, each of the first and the second resonators include first and second electrodes on the first surface of the piezoelectric resonator. In each of the first and second resonators, a bulk wave in a first thickness-shear mode is enclosed in the piezoelectric layer by one of a space defining a cavity in the support substrate or an air gap between the support substrate and the piezoelectric layer or an acoustic reflection layer including, between the support substrate and the piezoelectric layer, one or more low acoustic impedance layers and one or more high acoustic impedance layers. A first roughness of the second surface of the support substrate is greater than a second roughness of the first surface of the piezoelectric layer.

In an exemplary aspect, the first roughness can be greater than or equal to about 2 μm in surface roughness (Ra), can be greater than or equal to about 3.5 μm in surface roughness (Ra), or can be greater than or equal to about 3.8 μm in surface roughness (Ra). The first roughness can be less than or equal to about 8.5 μm in surface roughness (Ra).

In another exemplary aspect, the second surface of the support substrate can include periodic recesses and protrusions.

It is noted that the above and other elements, features, steps, characteristics and advantages of the present invention will become more apparent from the following detailed description of the preferred embodiments with reference to the attached drawings.

BRIEF DESCRIPTION OF THE DRAWINGS

FIG. 22 shows a state of scattering of wave vibrations in an acoustic wave device with a bottom surface that has not been roughened.

FIG. 23 shows a state of scattering of wave vibrations in an acoustic wave device with a bottom surface that has been periodically roughened.

DETAILED DESCRIPTION

Figure 1A:
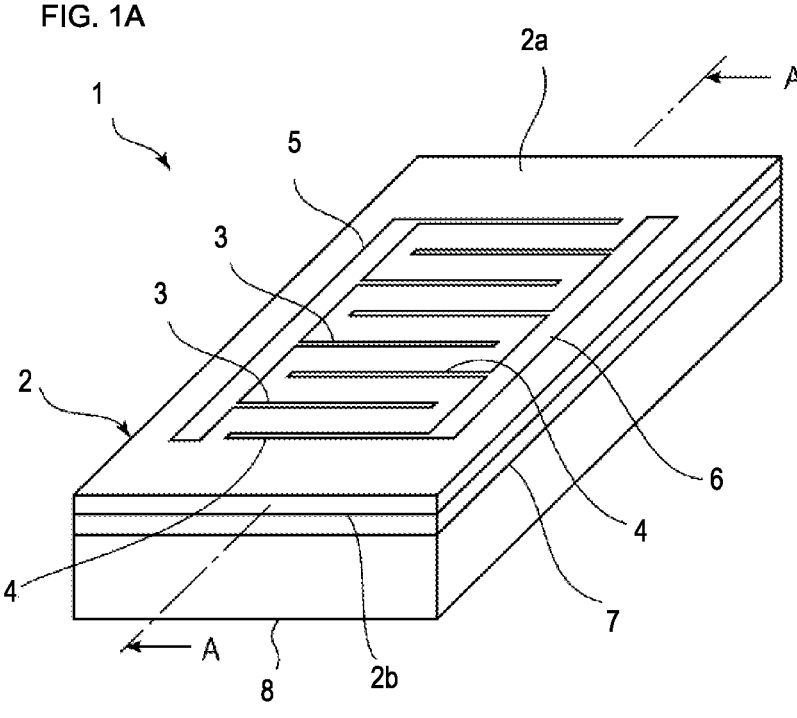
FIG. 1A is a schematic perspective view showing an acoustic wave device according to a first exemplary embodiment.

As described herein exemplary embodiments of the present invention include a piezoelectric layer 2 made of lithium niobate or lithium tantalate, and first and second electrodes 3, 4 opposed in a direction that intersects with a thickness direction of the piezoelectric layer 2.

In operation, a bulk wave in a first thickness-shear mode is used (e.g., excited). In addition, the first and the second electrodes 3, 4 can be adjacent electrodes, and, when a thickness of the piezoelectric layer 2 is d and a distance between a center of the first electrode 3 and a center of the second electrode 4 is p, a ratio d/p can be less than or equal to about 0.5, for example. With this configuration, the size of the acoustic wave device can be reduced, and the Q value or quality factor can be increased.

As shown, the acoustic wave device 1 includes a piezoelectric layer 2 made of LiNbO₃. Alternatively, the piezoelectric layer 2 can also be made of LiTaO₃. The cut angle of LiNbO₃ or LiTaO₃ can be Z-cut and can be rotated Y-cut or X-cut. A propagation direction of Y propagation or X propagation of about ±30° can be used, for example. The thickness of the piezoelectric layer 2 is not limited and can be greater than or equal to about 50 nm and can be less than or equal to about 1000 nm, for example, to effectively excite a first thickness-shear mode. The piezoelectric layer 2 has opposed first and second major surfaces 2a, 2b. The electrodes 3, 4 are disposed on the first major surface 2*a*, but can be disposed on the second major surface 2*b* in an alternative aspect. For purposes of this disclosure, the electrodes 3 are examples of the "first electrode" and can be referred to as "a plurality of first electrode fingers," and the electrodes 4 are examples of the "second electrode" and can be referred to as "a plurality of second electrode fingers." In FIG. 1A and FIGS. 1B, the plurality of electrodes 3 is connected to a first busbar 5, and the plurality of electrodes 4 is connected to a second busbar 6. The electrodes 3, 4 can be interdigitated with each other. The electrodes 3, 4 each can have a rectangular shape and can have a length direction. In a direction perpendicular to the length direction, each of the electrodes 3 and an adjacent one of the electrodes 4 are opposed to each other. In general, an IDT (interdigital transducer) electrode can be defined by the electrodes 3, 4, the first busbar 5, and the second busbar 6. The length direction of the electrodes 3, 4 and the direction perpendicular to the length direction of the electrodes 3, 4 both are directions that intersect with a thickness direction of the piezoelectric layer 2. For this reason, each of the electrodes 3 and the adjacent one of the electrodes 4 can be regarded as being opposed to each other in the direction that intersects with the thickness direction of the piezoelectric layer 2. Alternatively, the length direction of the electrodes 3, 4 can be interchanged with the direction perpendicular to the length direction of the electrodes 3, 4, shown in FIGS. 1A and 1B. In other words, in FIGS. 1A and 1B, the electrodes 3, 4 can extend in a direction in which the first busbar 5 and the second busbar 6 extend. In this case, the first busbar 5 and the second busbar 6 extend in the direction in which the electrodes 3, 4 extend in FIGS. 1A and 1B. Pairs of adjacent electrodes 3 connected to one potential and electrodes 4 connected to the other potential are provided in the direction perpendicular to the length direction of the electrodes 3, 4. A state where the electrodes 3, 4 are adjacent to each other does not mean that the electrodes 3, 4 are in direct contact with each other and instead means that the electrodes 3, 4 are disposed via a gap. When the electrodes 3, 4 are adjacent to each other, no electrode connected to a hot electrode or a ground electrode, including the other electrodes 3, 4, is disposed between the electrodes 3, 4.

It is noted that the number of the pairs of electrodes 3, 4 is not necessarily an integer number of pairs and can be 1.5 pairs, 2.5 pairs, or the like. For example, 1.5 pairs of electrodes means that there are three electrodes 3, 4, two of which is in a pair of electrodes and one of which is not in a pair of electrodes. A distance between the centers of the electrodes 3, 4, that is, the pitch of the electrodes 3, 4, can fall within the range of greater than or equal to about 1 μm and less than or equal to about 10 μm, for example. Moreover, a distance between the centers of the electrodes 3, 4 can be a distance between the center of the width dimension of the electrodes 3, 4 in the direction perpendicular to the length direction of the electrodes 3, 4. In addition, when there is more than one electrode 3, 4 (e.g., when the number of electrodes 3, 4 is two such that the electrodes 3, 4 define an electrode pair, or when the number of electrodes 3, 4 is three or more such that electrodes 3, 4 define 1.5 or more electrode pairs), a distance between the centers of the electrodes 3, 4 means an average of a distance between any adjacent electrodes 3, 4 of the 1.5 or more electrode pairs. The width of each of the electrodes 3, 4, that is, the dimension of each of the electrodes 3, 4 in the opposed direction that is perpendicular to the length direction, can fall within the range of greater than or equal to about 150 nm and less than or equal to about 1000 nm, for example. A distance between the centers of the electrodes 3, 4 can be a distance between the center of the dimension of the electrode 3 in the direction perpendicular to the length direction of the electrode 3 (e.g., the width dimension) and the center of the dimension of the electrode 4 in the direction perpendicular to the length direction of the electrode 4 (e.g., the width dimension).

Because the Z-cut piezoelectric layer in an exemplary aspect, the direction perpendicular to the length direction of the electrodes 3, 4 is a direction perpendicular to a polarization direction of the piezoelectric layer 2. When a piezoelectric body with another cut angle is used as the piezoelectric layer 2, this does not apply. For purposes of this disclosure, the term "perpendicular" is not limited only to a strictly perpendicular case and can be substantially perpendicular (e.g., an angle formed between the direction perpendicular to the length direction of the electrodes 3, 4 and the polarization direction can be, for example, about 90°±10°).

Figure 2:
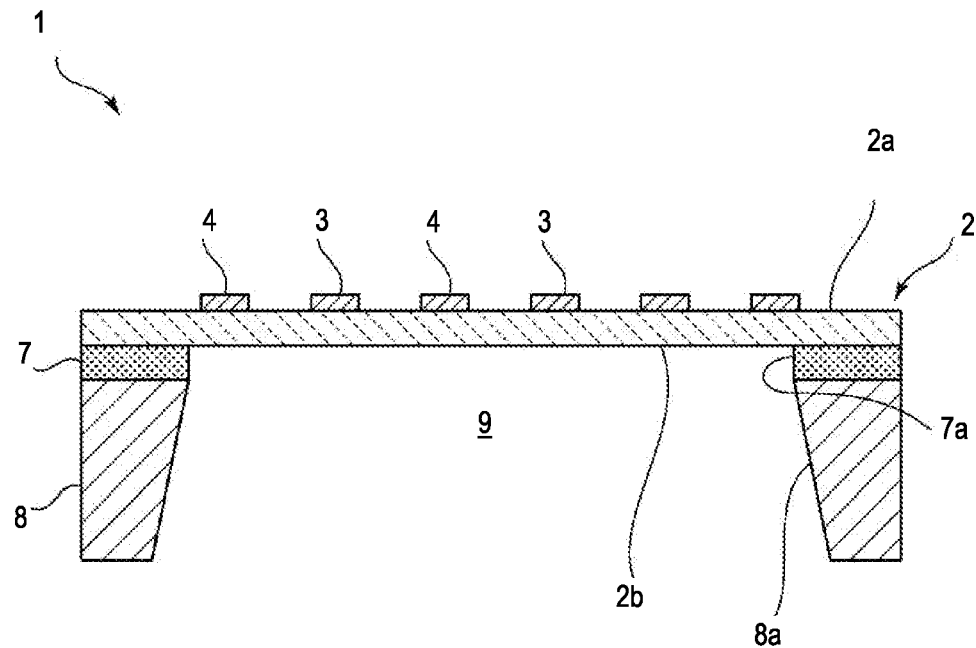
FIG. 2 is a cross-sectional view taken along the line A-A in FIG. 1A.

Moreover, support substrate 8 can be laminated via an electrically insulating layer or dielectric film 7 to the second major surface 2*b* of the piezoelectric layer 2. As shown in FIG. 2, the electrically insulating layer 7 can have a frame shape and can include an opening 7*a*, and the support substrate 8 can have a frame shape and can include an opening 8*a*. With this configuration, a cavity 9 can be formed in the electrically insulating layer and/or in the support substrate 8 according to exemplary aspects. The cavity 9 can be provided so as not to impede vibrations of an excitation region C of the piezoelectric layer 2. Therefore, the support substrate 8 can be laminated to the second major surface 2*b* via the electrically insulating layer 7 at a location that does not overlap a portion where at least one electrode pair is provided. The electrically insulating layer 7 does not need to be provided in an alternative aspect. Therefore, the support substrate 8 can be laminated directly or indirectly on the second major surface 2*b* of the piezoelectric layer 2.

The electrically insulating layer 7 can be made of silicon oxide. Other than silicon oxide, an appropriate electrically insulating material, such as silicon oxynitride and alumina, can also be used. The support substrate 8 can be made of Si or other suitable material. A plane direction of the Si can be (100) or (110) or (111). High-resistance Si with a resistivity higher than or equal to about 4 kΩ, for example, can be used. The support substrate 8 can also be made of an appropriate electrically insulating material or an appropriate semiconductor material. Examples of the material of the support substrate 8 include a piezoelectric body, such as aluminum oxide, lithium tantalate, lithium niobate, and quartz crystal; various ceramics, such as alumina, magnesia, sapphire, silicon nitride, aluminum nitride, silicon carbide, zirconia, cordierite, mullite, steatite, and forsterite; a dielectric, such as diamond and glass; and a semiconductor, such as gallium nitride.

The first and the second electrodes 3, 4 and the first and the second busbars 5, 6 can be made of an appropriate metal or alloy, such as Al and AlCu alloy. The first and the second electrodes 3, 4 and the first and the second busbars 5, 6 can include a structure such as an Al film that can be laminated on a Ti film. An adhesion layer other than a Ti film can be used in alternative aspects.

In operation, to drive the acoustic wave device 1, an alternating-current voltage is applied between the first and the second electrodes 3, 4. More specifically, an alternating-current voltage is applied between the first and the second busbar 5, 6 to excite a bulk wave in a first thickness-shear mode in the piezoelectric layer 2. In the acoustic wave device 1, when the thickness of the piezoelectric layer 2 is d and a distance between the centers of adjacent first and second electrodes 3, 4 of the electrode pairs is p, the ratio d/p can be less than or equal to about 0.5, for example. For this reason, a bulk wave in the first thickness-shear mode can be effectively excited, which results in good resonant characteristics being obtained. The ratio d/p can be less than or equal to about 0.24, and, in this case, even more improved resonant characteristics can be obtained. When there is more than one electrode, the distance p between the centers of the adjacent electrodes 3, 4 is an average distance of the distance between the centers of any adjacent electrodes 3, 4.

With the above configuration, the Q value or quality factor of the acoustic wave device 1 is unlikely to decrease, even when the number of electrode pairs is reduced for size reduction. That is, the Q value is unlikely to decrease if the number of electrode pairs is reduced because the acoustic wave device 1 is a resonator that needs no reflectors on both sides, and therefore, a propagation loss is small. No reflectors are needed because a bulk wave in a first thickness-shear mode is used.

The difference between a Lamb wave used in conventional acoustic wave devices and a bulk wave in the first thickness-shear mode used in exemplary embodiments of the present invention is described with reference to FIGS. 3A and 3B.

Figure 3A:
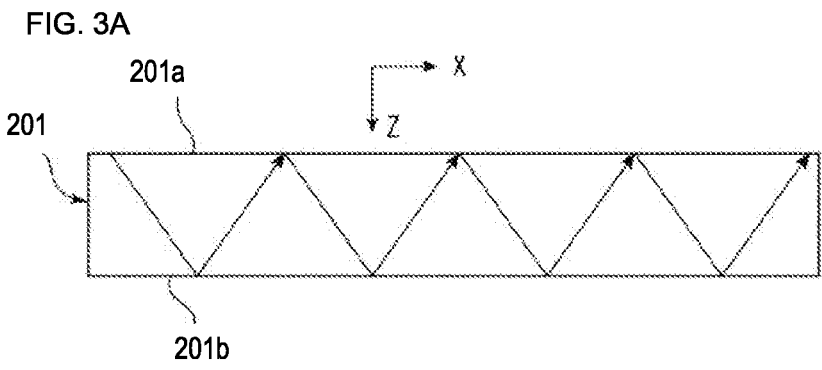
FIG. 3A is a schematic elevational cross-sectional view that shows a Lamb wave propagating in a piezoelectric film of an acoustic wave device.

FIG. 3A is a schematic elevational cross-sectional view for illustrating a Lamb wave propagating in a piezoelectric film of an acoustic wave device as described in Japanese Unexamined Patent Application Publication No. 2012-257019.

The wave propagates in a piezoelectric film 201 as indicated by the arrows in FIG. 3A. In the piezoelectric film 201, a first major surface 201a and a second major surface 201b are opposed to each other, and a thickness direction connecting the first major surface 201a and the second major surface 201b is a Z direction. An X direction is a direction in which electrode fingers of an interdigital transducer electrode are arranged. As shown in FIG. 3A, a Lamb wave propagates in the X direction. The Lamb wave is a plate wave, so the piezoelectric film 201 vibrates as a whole. However, the wave propagates in the X direction. Therefore, resonant characteristics are obtained by arranging reflectors on both sides. For this reason, a wave propagation loss occurs, and the Q value or quality factor decreases when the size is reduced, that is, when the number of electrode pairs is reduced.

Figure 3B:
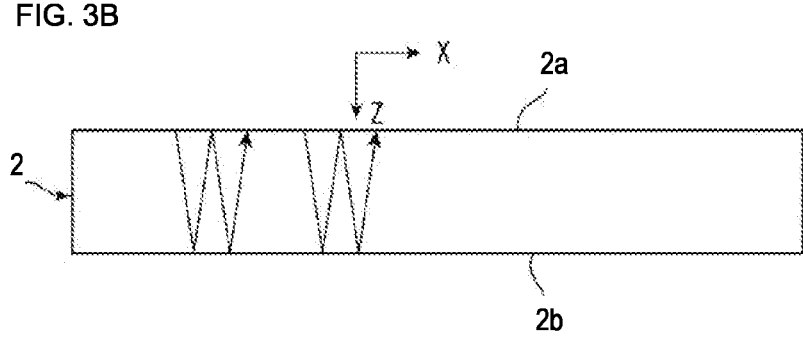
FIG. 3B is a cross-sectional view that shows a bulk wave propagating in a piezoelectric film of an acoustic wave device.

In contrast, as shown in FIG. 3B, in the acoustic wave device 1, a vibration displacement is caused in the thickness-shear direction, so the wave propagates substantially in the direction connecting the first and the second major surfaces 2a, 2b of the piezoelectric layer 2, that is, the Z direction, and resonates. In other words, the X-direction component of the wave is significantly smaller than the Z-direction component. Since the resonant characteristics are obtained from the propagation of the wave in the Z direction, no reflectors are needed. Thus, there is no propagation loss caused when the wave propagates to reflectors. Therefore, even when the number of electrode pairs is reduced to reduce size, the Q value or quality factor is unlikely to decrease.

Figure 1B:
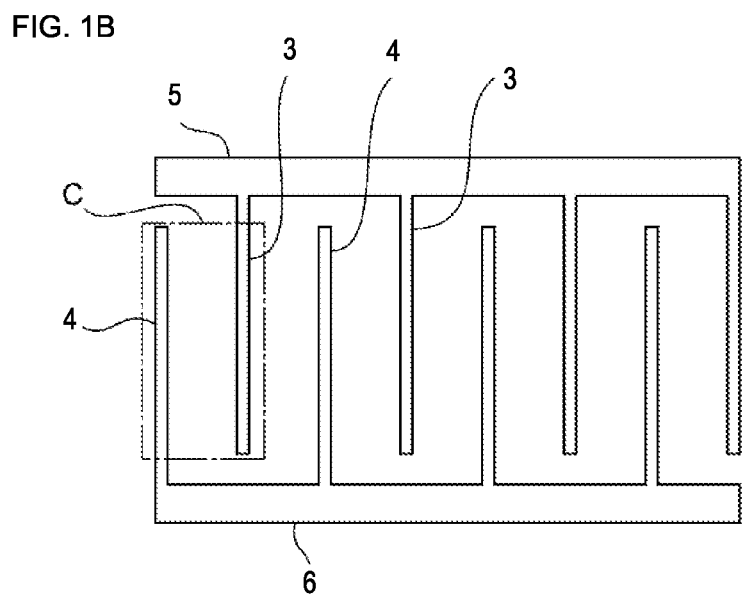
FIG. 1B is a plan view showing an electrode structure on a piezoelectric layer.
Figure 4:
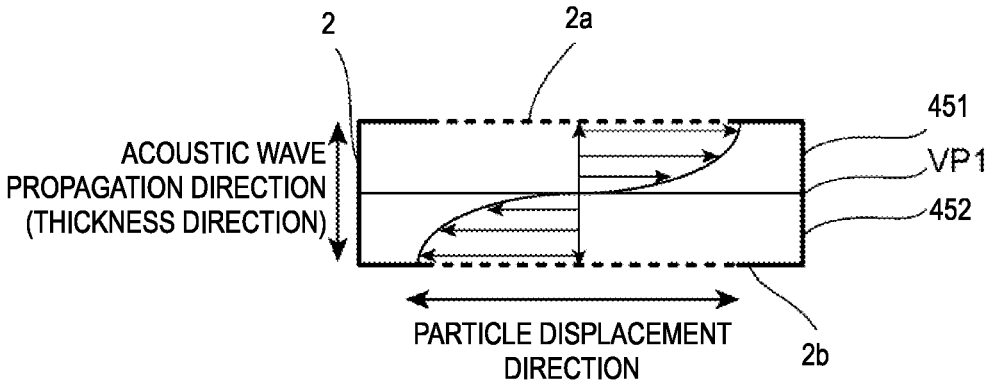
FIG. 4 schematically shows a bulk wave when a voltage is applied across the electrodes of an acoustic wave device.

As shown in FIG. 4, the amplitude direction of the bulk wave in the first thickness-shear mode is opposite in a first region 451 included in the excitation region C of the piezoelectric layer 2 and a second region 452 included in the excitation region C, where the excitation region C is shown in FIG. 1B. FIG. 4 schematically shows a bulk wave when a higher voltage is applied to the electrodes 4 than a voltage applied the electrodes 3. The first region 451 is a region in the excitation region C between the first major surface 2a and a virtual plane VP1 that is perpendicular to the thickness direction of the piezoelectric layer 2 and that divides the piezoelectric layer 2 into two. The second region 452 is a region in the excitation region C between the virtual plane VP1 and the second major surface 2b.

As described above, the acoustic wave device 1 includes at least one electrode pair. However, the wave is not propagated in the X direction, so the number of electrode pairs does not necessarily need to be two or more. In other words, only one electrode pair can be provided.

For example, the first electrode 3 is an electrode connected to a hot potential, and the second electrode 4 is an electrode connected to a ground potential. Of course, the first electrode 3 can be connected to a ground potential, and the second electrode 4 can be connected to a hot potential in an alternative aspect. Moreover, each first or second electrode 3, 4 can be connected to a hot potential or can be connected to a ground potential as described above, and no floating electrode is provided.

Figure 5:
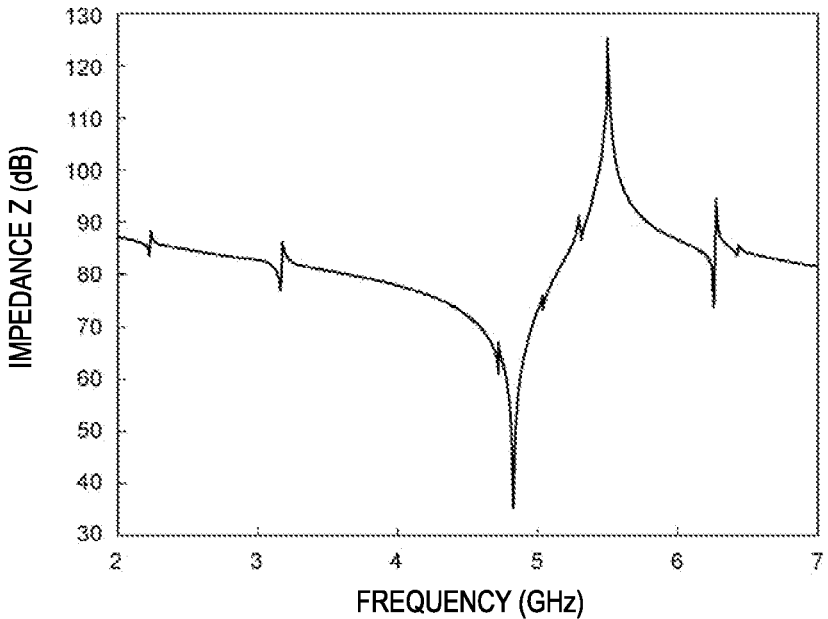
FIG. 5 is a graph showing the resonant characteristics of the acoustic wave device according to the first exemplary embodiment.

FIG. 5 is a graph showing the resonant characteristics of the acoustic wave device 1. The design parameters of the acoustic wave device 1 having the resonant characteristics are as follows. The piezoelectric layer 2 is made of LiNbO₃ with Euler angles of (0°, 0°, 90°) and has a thickness of about 400 nm, for example. But, as explained above, the piezoelectric layer 2 can be LiTaO₃, and other suitable Euler angles and thicknesses can be used.

When viewed in a direction perpendicular to the length direction of the first and the second electrodes 3, 4, the length of a region in which the first and the second electrodes 3, 4 overlap, that is, the excitation region C, can be about 40 μm, the number of electrode pairs of electrodes 3, 4 can be 21, the distance between the centers of the first and the second electrodes 3, 4 can be about 3 μm, the width of each of the first and the second electrodes 3, 4 can be about 500 nm, and the ratio d/p can be about 0.133, for example.

The electrically insulating layer 7 can be made of a silicon oxide film having a thickness of about 1 μm, for example.

The support substrate 8 can be made of Si.

The length of the excitation region C can be along the length direction of the first and the second electrodes 3, 4.

The distance between any adjacent electrodes of the electrode pairs can be equal or substantially equal within manufacturing and measurement tolerances among all of the electrode pairs. In other words, the first and the second electrodes 3, 4 can be disposed at a constant pitch.

As is apparent from FIG. 5, although no reflectors are provided, good resonant characteristics with a fractional bandwidth of about 12.5% can be obtained.

When the thickness of the piezoelectric layer 2 is d and the distance between the centers of the electrode pairs is p, the ratio d/p can be less than or equal to about 0.5 or can be less than or equal to about 0.24, for example. The ratio d/p will be further discussed with reference to FIG. 6 below.

Figure 6:
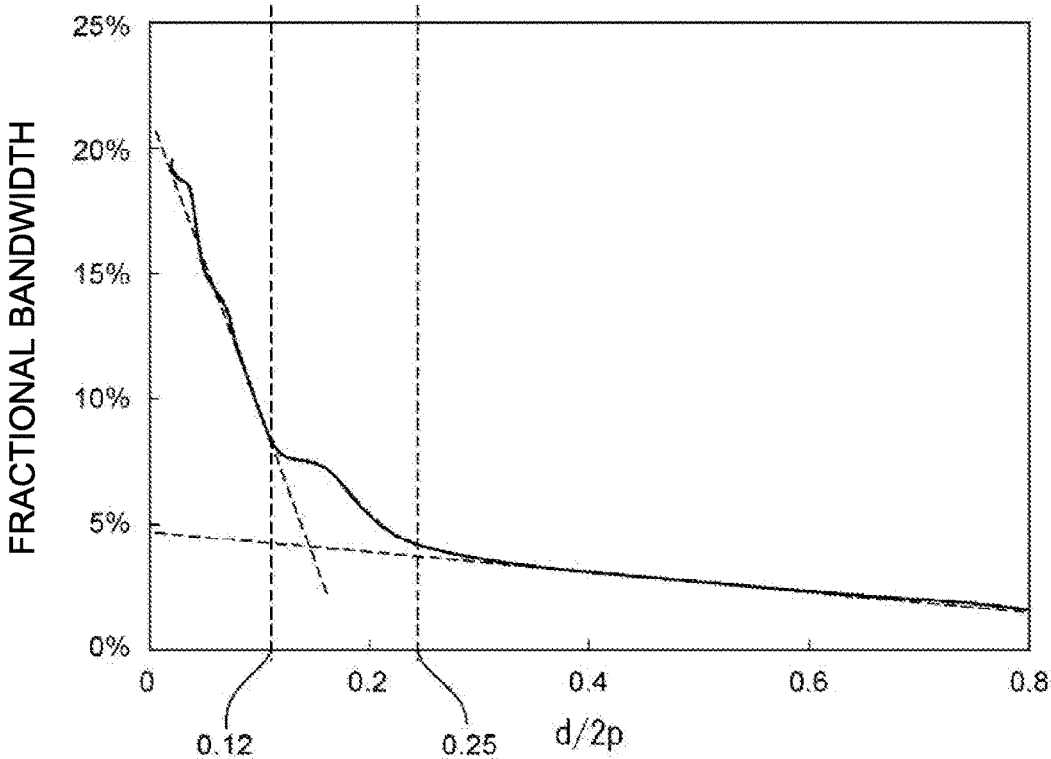
FIG. 6 is a graph showing the relationship between the ratio d/2p and the fractional bandwidth of the acoustic wave device as a resonator.

Acoustic wave devices can be provided with different ratios d/2p as in the case of the acoustic wave device having the resonant characteristics shown in FIG. 5. FIG. 6 is a graph showing the relationship between the ratio d/2p and the fractional bandwidth when the acoustic wave device 1 is used as a resonator.

As is apparent from the non-limiting example shown in FIG. 6, when the ratio d/2p>0.25 (i.e., the ratio d/p>0.5), the fractional bandwidth is lower than about 5%, even when the ratio d/p is adjusted. In contrast, in the case where the ratio d/2p≤0.25 (i.e., the ratio d/p≤0.5), the ratio d/p changes within the range, and the fractional bandwidth can be set to about 5% or higher, that is, a resonator having a high coupling coefficient can be provided, for example. In the case where the ratio d/2p is lower than or equal 0.12 (i.e., the ratio d/p is lower than or equal to about 0.24), the fractional bandwidth can be increased to about 7% or higher, for example. In addition, when the ratio d/p is adjusted within the range, a resonator having a further wide fractional bandwidth can be obtained, so a resonator having a higher coupling coefficient can be achieved. Therefore, when the ratio d/p is set to about 0.5 or less, for example, a resonator that uses a bulk wave in the first thickness-shear mode with a high coupling coefficient is provided.

As described above, at least one electrode pair can be one pair, and, in the case of one electrode pair, p is defined as the distance between the centers of the adjacent first and second electrodes 3, 4. In the case of 1.5 or more electrode pairs, an average distance of the distance between the centers of any adjacent electrodes 3, 4 can be defined as p.

For the thickness d of the piezoelectric layer 2, when the piezoelectric layer 2 has thickness variations, an average value of the thicknesses can be used.

Figure 7:
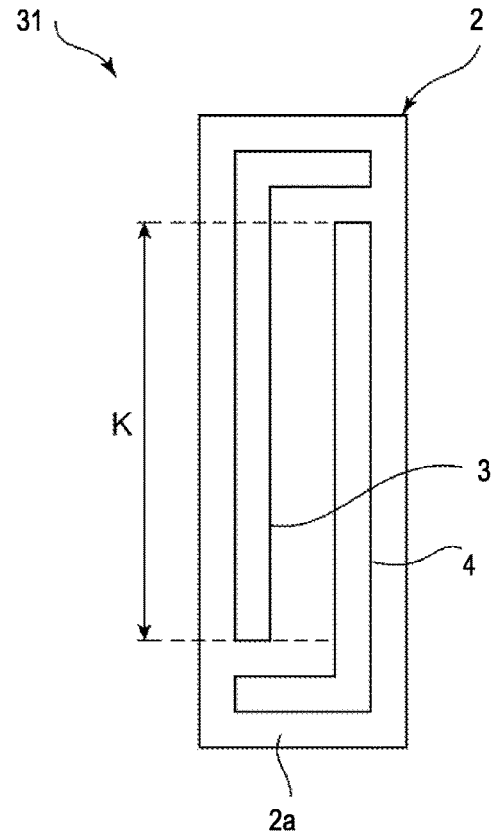
FIG. 7 is a plan view of an acoustic wave device according to a second exemplary embodiment.

FIG. 7 is a plan view of an acoustic wave device 31 according to a second exemplary embodiment. In the acoustic wave device 31, one electrode pair including the first and the second electrodes 3, 4 is provided on the first major surface 2a of the piezoelectric layer 2. Alternatively, the electrodes 3, 4 can be provided on the second major surface 2b of the piezoelectric layer 2. In FIG. 7, K is an overlap width. As described above, in the acoustic wave device 31, the number of electrode pairs can be one. In this case as well, when the ratio d/p is less than or equal to about 0.5, for example, a bulk wave in a first thickness-shear mode can be effectively excited.

Figure 8:
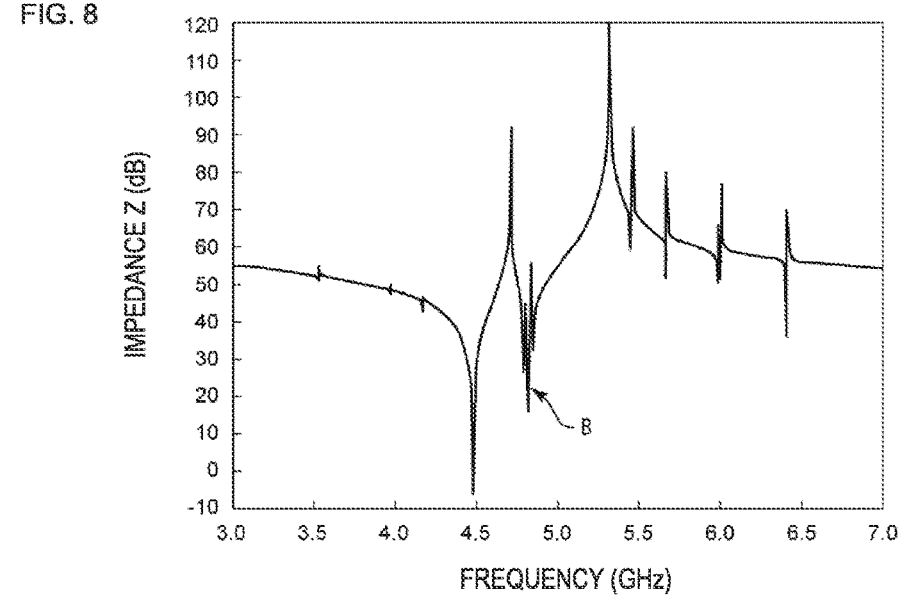
FIG. 8 is a reference graph showing an example of the resonant characteristics of the acoustic wave device according to an exemplary embodiment.

In the acoustic wave device 31, a metallization ratio MR of an area of any adjacent first and second electrodes 3, 4 within the excitation region, i.e., a region in which any adjacent electrodes 3, 4 overlap when viewed in the opposed direction, to a total area of the excitation region C, can satisfy $MR \leq 1.75$ (d/p)+0.075, effectively reducing spurious occurrences. This reduction will be described with reference to FIGS. 8 and 9. FIG. 8 is a reference graph showing an example of the resonant characteristics of the acoustic wave device 31. The spurious occurrence indicated by the arrow B appears between a resonant frequency and an anti-resonant frequency. The ratio d/p can be set to about 0.08, and the Euler angles of $LiNbO_3$ can be set to (0°, 0°, 90°), for example. The metallization ratio MR can be set to about 0.35, for example.

The metallization ratio MR will be described with reference to FIG. 1B. In the electrode structure of FIG. 1B, when focusing on one electrode pair, it is assumed that only the one electrode pair is provided. In this case, the portion surrounded by the alternate long and short dashed line C is the excitation region. The excitation region C includes, when the first and the second electrodes 3, 4 are viewed in the direction perpendicular to the length direction of the first and the second electrodes 3, 4, that is, the opposed direction, a first region of the first electrode 3 overlapping with the second electrode 4, a second region of the second electrode 4 overlapping with the first electrode 3, and a third region in which the first and the second electrodes 3, 4 overlap in a region between the first and the second electrodes 3, 4. Then, the ratio of the area of the first and the second electrodes 3, 4 in the excitation region C to the area of the excitation region C is the metallization ratio MR. In other words, the metallization ratio MR is the ratio of the area of a metallization portion to the area of the excitation region C.

When a plurality of electrode pairs is provided, the ratio of a metallization portion included in the total excitation region to the total area of the excitation region is the metallization ratio MR. That is, the metallization ratio MR can be the ratio of an area of the first and the second electrodes 3, 4 within an overlapping region, i.e., a region in which the first and the second electrodes 3, 4 overlap each other, to a total area of the overlapping region.

Figure 9:
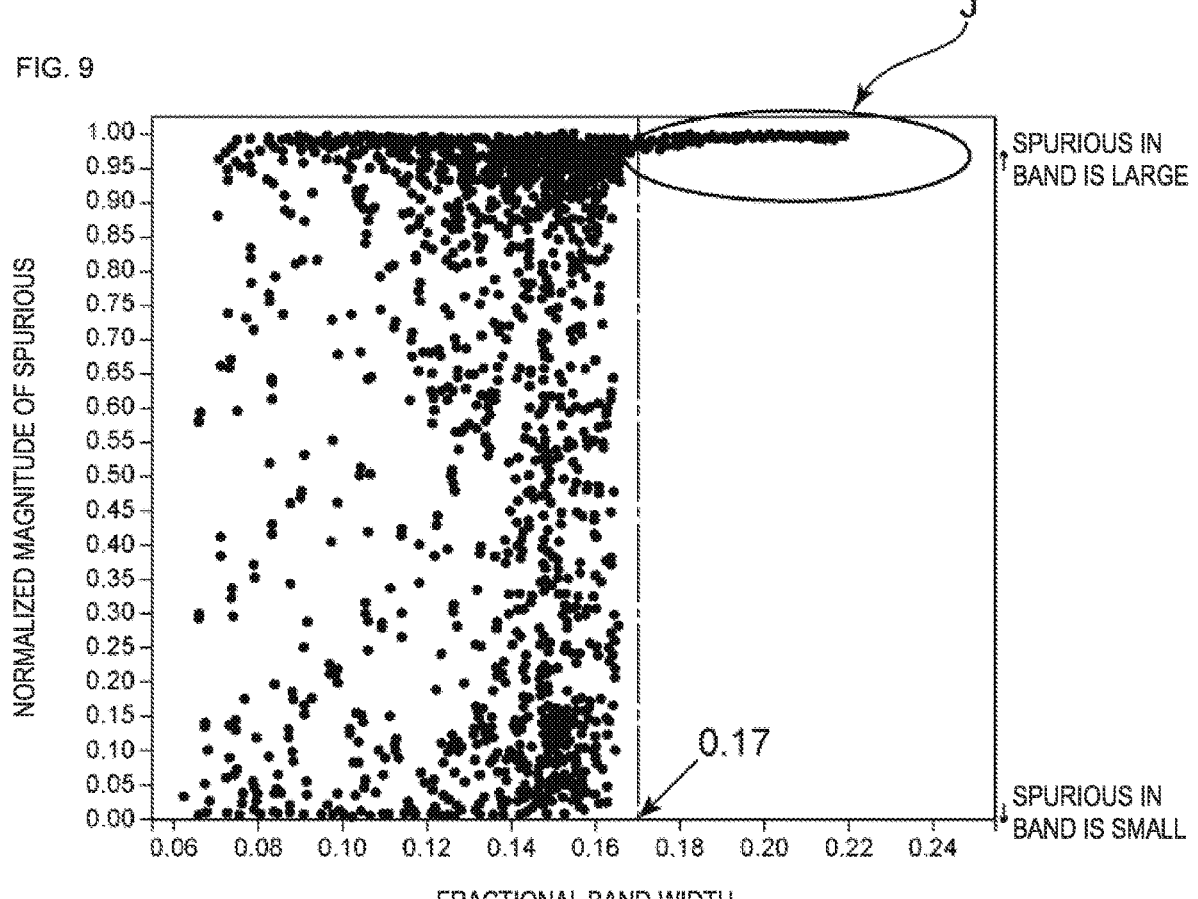
FIG. 9 is a graph showing the relationship between a fractional bandwidth and the magnitude of normalized spurious for a large number of acoustic wave resonators.

FIG. 9 is a graph showing the relationship between a fractional bandwidth and a magnitude of normalized spurious for a large number of acoustic wave resonators in which a phase rotation amount of impedance of spurious is normalized by 180° as the magnitude of spurious. The phase rotation amount of impedance is an indicator of the magnitude of spurious, which is related to the impedance ratio. The impedance ratio relates to the difference between the minimum value and the maximum value of the impedance, while the phase rotation amount of impedance relates to the peak value of the impedance. For the fractional bandwidth, the film thickness of the piezoelectric layer 2 and the dimensions of the first and the second electrodes 3, 4 are variously changed and adjusted. FIG. 8 is graph showing the resonant characteristics when material of the piezoelectric layer 2 is Z-cut $LiNbO_3$, and similar resonant characteristics can be obtained when the material of the piezoelectric layer 2 uses another cut angle.

In a region surrounded by the ellipse J in FIG. 9, the spurious is about 1.0 and large. As is apparent from FIG. 9, when the fractional bandwidth exceeds about 0.17, that is, about 17%, large spurious having a spurious level greater than or equal to one appears in a pass band, even when parameters of the fractional bandwidth are changed. In other words, as in the case of the resonant characteristics shown in FIG. 8, large spurious indicated by the arrow B appears in the pass band. Thus, the fractional bandwidth is preferably lower than or equal to about 17%, for example. In this case, spurious can be reduced by adjusting the film thickness of the piezoelectric layer 2, the dimensions of the first and the second electrodes 3, 4, and the like.

Figure 10:
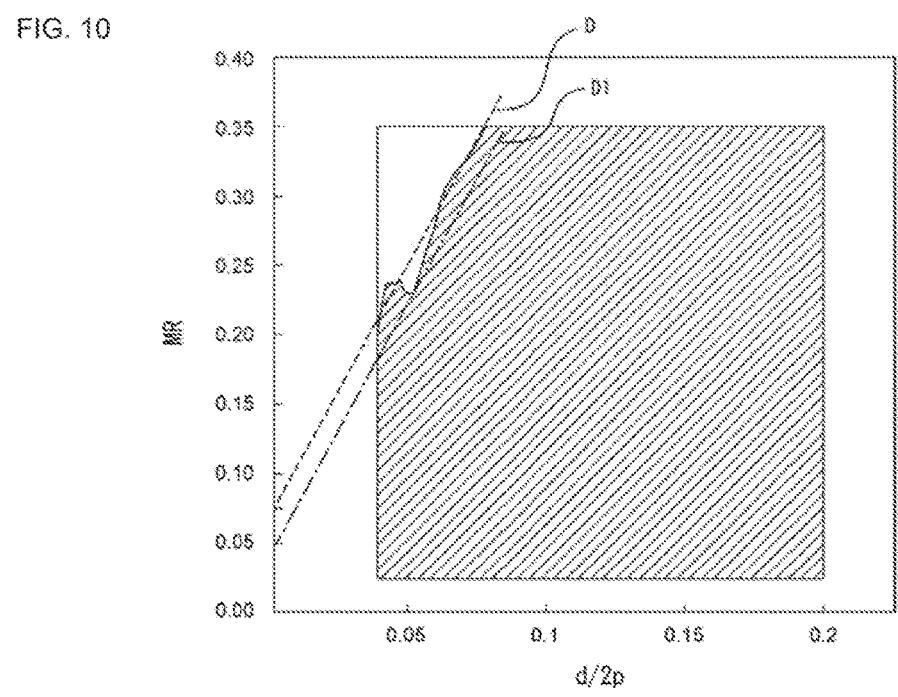
FIG. 10 is a graph showing the relationship among the ratio d/2p, the metallization ratio MR, and the fractional bandwidth.

FIG. 10 is a graph showing the relationship among the ratio d/2p, the metallization ratio MR, and the fractional bandwidth. The fractional bandwidths of various acoustic wave devices with different ratios d/2p and with different metallization ratios MR are measured. The hatched portion on the right-hand side of the dashed line D in FIG. 10 is a region in which the fractional bandwidth is lower than or equal to about 17%, for example. The dashed line D between the hatched region and a non-hatched region is expressed by $MR=3.5$ (d/2p)+0.075=1.75 (d/p)+0.075. When the metallization ratio MR satisfies $MR \leq 1.75$ (d/p)+0.075, the fractional bandwidth can be set to about 17% or lower, for example. Additionally, FIG. 10 shows a long- and short-dashed line D1 expressed by $MR=3.5$ (d/2p)+0.05. When the metallization ratio MR satisfies $MR \leq 1.75$ (d/p)+0.05, the fractional bandwidth can be reliably set to about 17% or lower, for example.

Figure 11:
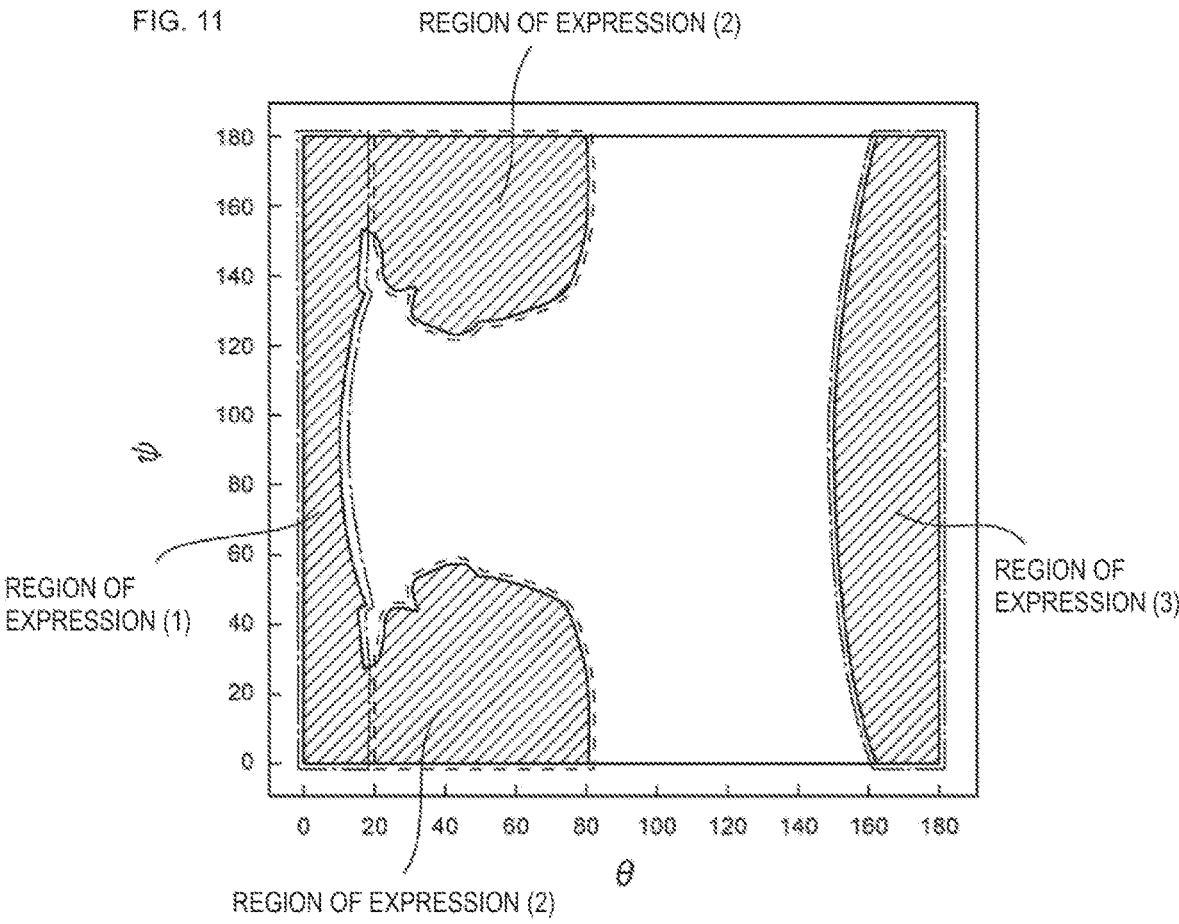
FIG. 11 is a diagram showing a map of a fractional bandwidth of the Euler angles (0°, θ, ψ) of LiNbO₃ when the ratio d/p is brought close to zero without limit.

FIG. 11 is a diagram showing a map of the fractional bandwidth for the Euler angles (0°, θ, ψ) of $LiNbO_3$ when the ratio d/p is brought close to zero without limit. The hatched portions in FIG. 11 are regions in which the fractional bandwidth is at least about 5% or higher, and the boundaries of the hatched portions are approximated by the following expressions (1), (2), and (3):

$$(0° \pm 10°, 0° \text{ to } 20°, \text{ any } \psi) \tag{1}$$

$$(0° \pm 10°, 20° \text{ to } 80°, 0° \text{ to } 60°(1-(\theta-50)^2/900)^{1/2}) \text{ or}$$

$$(0°±10°,20° \text{ to } 80°,[180°-60°(1-(\theta-50)^2/900)^{1/2}] \text{ to } 180°) \tag{2}$$

$$(0°±10°,[180°-30°(1-(\psi-90)^2/8100)^{1/2}] \text{ to } 180°, \text{ any } \psi) \tag{3}$$

Therefore, when the Euler anglers of the material used for the piezoelectric layer 2 of an acoustic wave resonator satisfy the above expressions (1), (2), and (3), the fractional bandwidth of the acoustic wave resonator can be sufficiently widened.

Figure 12:
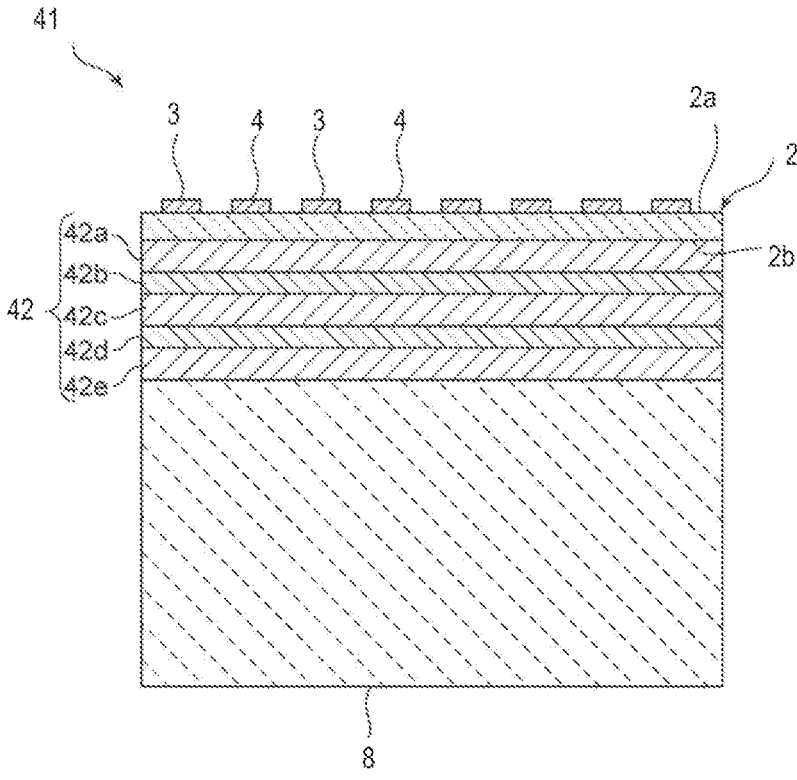
FIG. 12 is a cross-sectional view of an acoustic wave device including an acoustic multilayer film.

FIG. 12 is a cross-sectional view of an acoustic wave device 41 that includes an acoustic multilayer film 42 laminated on the second major surface 2b of the piezoelectric layer 2. The acoustic multilayer film 42 includes a multilayer structure of low acoustic impedance layers 42a, 42c, 42e having a relatively low acoustic impedance and of high acoustic impedance layers 42b, 42d having a relatively high acoustic impedance. This multilayer structure can be referred to as a Bragg mirror or Bragg reflector. Using the acoustic multilayer film 42 allows a bulk wave in a first thickness-shear mode to be enclosed in the piezoelectric layer 2 without using the cavity 9 in the acoustic wave device 1. In the acoustic wave device 41, resonant characteristics based on a bulk wave in a first thickness-shear mode can be obtained by setting the ratio d/p to about 0.5 or less. In the acoustic multilayer film 42, the number of the laminated low acoustic impedance layers 42a, 42c, 42e and the number of the laminated high acoustic impedance layers 42b, 42d are not limited. The bulk wave in a first thickness-shear mode can be enclosed if at least one of the high acoustic impedance layers 42b, 42d is farther from the piezoelectric layer 2 than the low acoustic impedance layers 42a, 42c, 42c.

The low acoustic impedance layers 42a, 42c, 42e and the high acoustic impedance layers 42b, 42d can include any suitable materials such that the relationship among the acoustic impedance layers is satisfied. Examples of the material of the low acoustic impedance layers 42a, 42c, 42e may include, for example, silicon oxide and silicon oxynitride. Examples of the material of the high acoustic impedance layers 42b, 42d may include, for example, alumina, silicon nitride, and metals.

Figure 13:
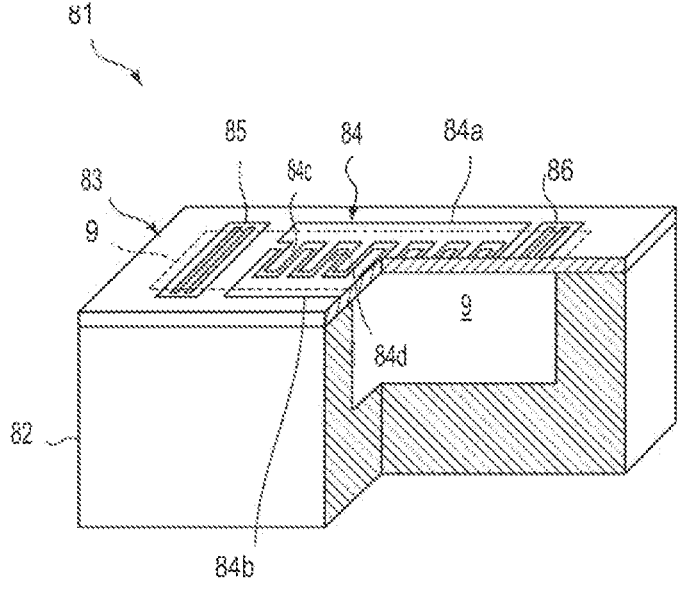
FIG. 13 is a partially cutaway perspective view of an acoustic wave device including a top-open recess.
Figure 14:
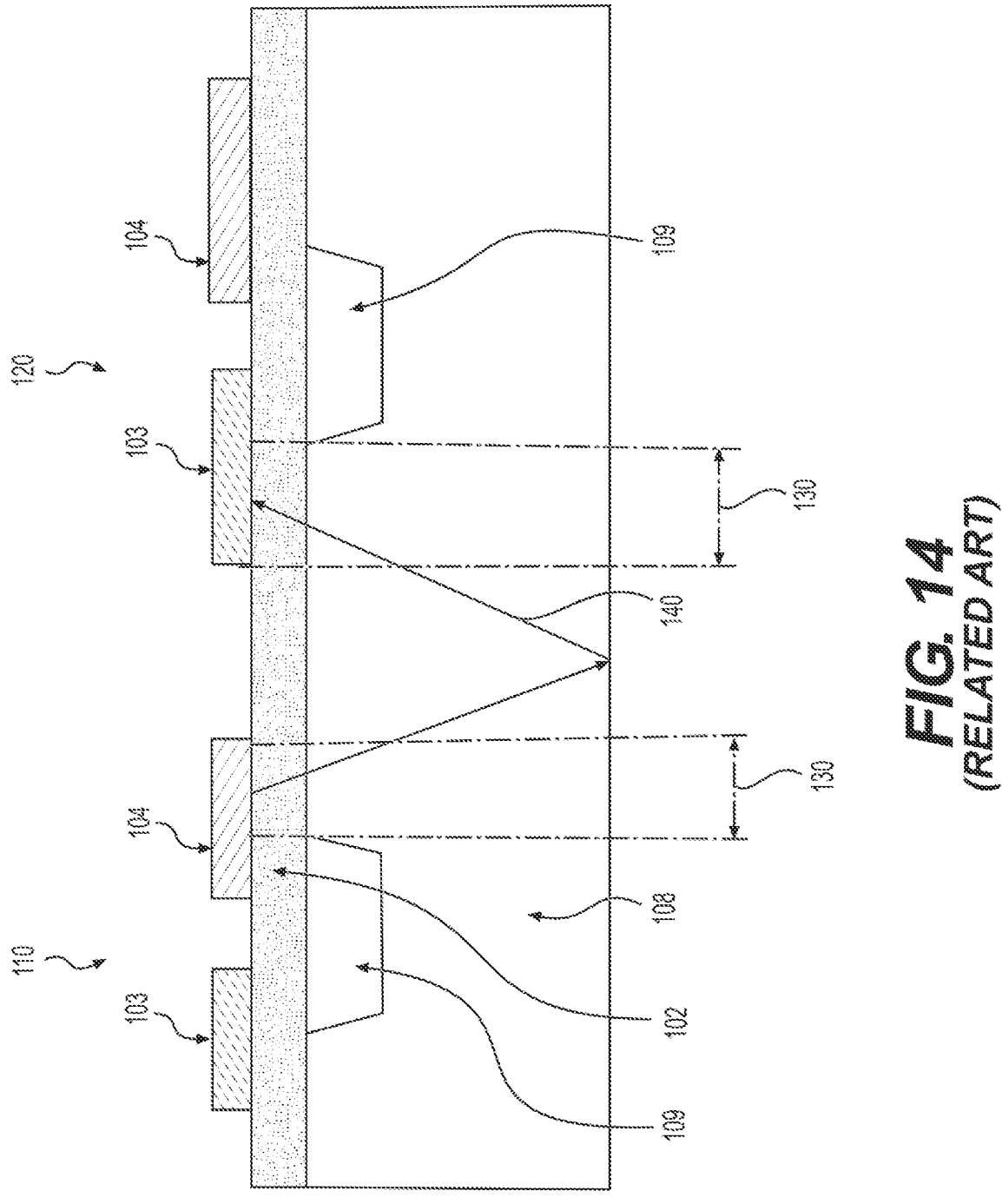
FIG. 14 is a cross-sectional view of an acoustic wave device of the related art with first and second resonators.
Figure 15:
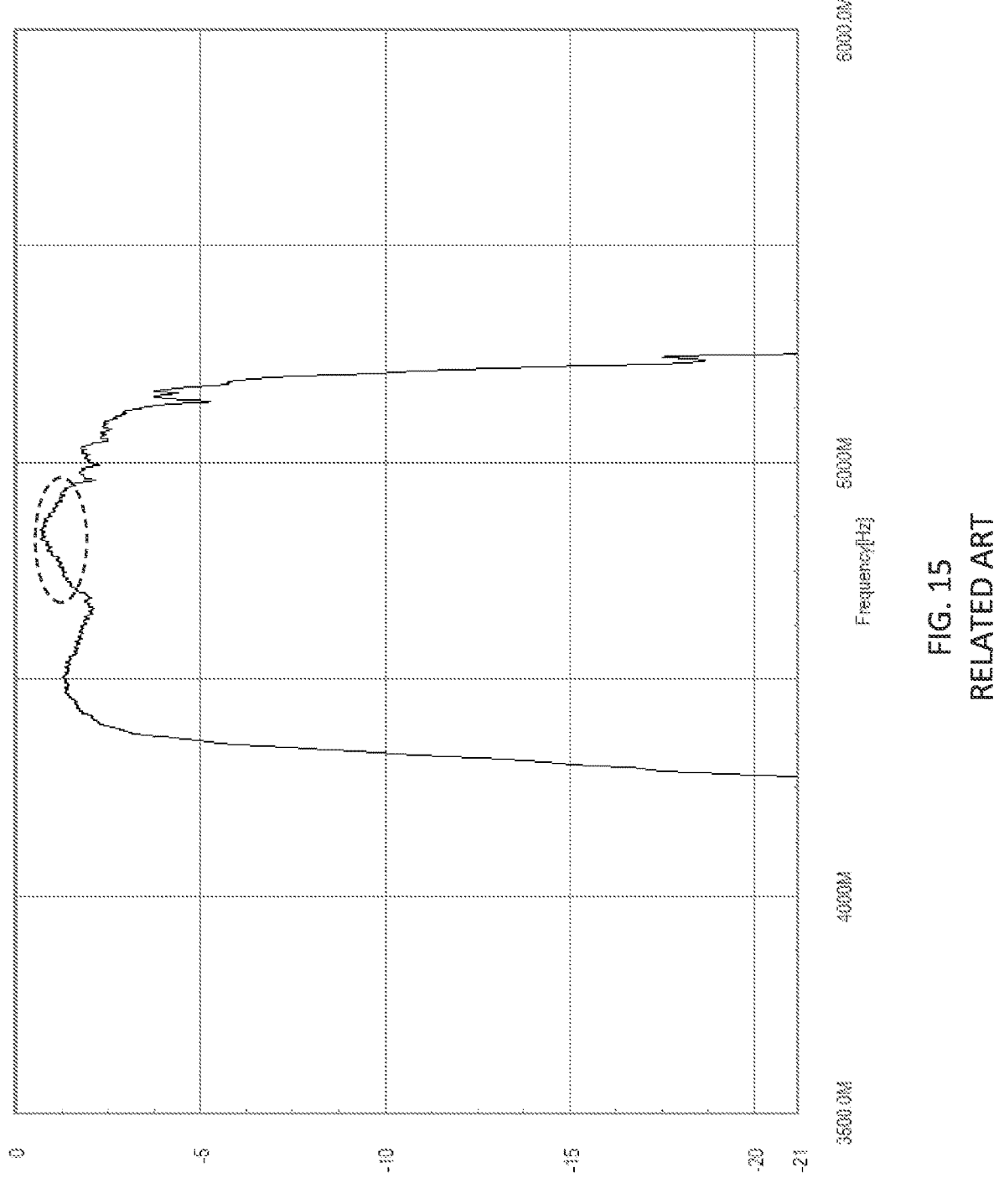
FIG. 15 is a graph showing the pass band of the acoustic wave device of the related art of FIG. 14.
Figure 16:
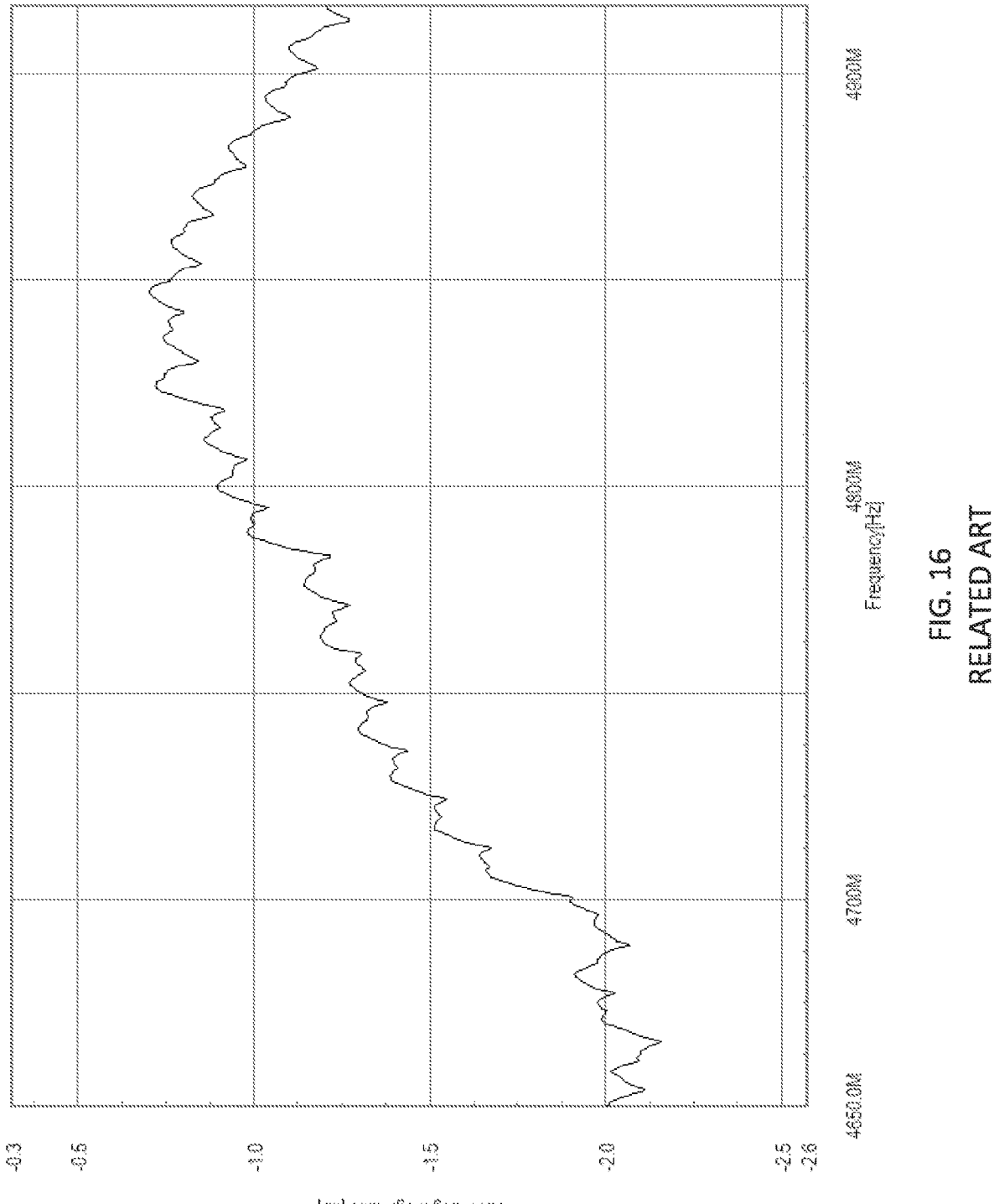
FIG. 16 is a close-up view of the graph of FIG. 15 showing the ripple of the pass band of the acoustic wave device of the related art of FIG. 14.

FIG. 13 is a partially cutaway perspective view of the acoustic wave device 81 that includes a support substrate 82 that has a cavity 9 defining a top-open recess. A piezoelectric layer 83 is laminated on the support substrate 82, defining the cavity 9. An interdigital transducer (IDT) electrode 84 is provided on the piezoelectric layer 83 above the cavity 9. Reflectors 85, 86 are respectively provided on both sides of the IDT electrode 84 in an acoustic wave propagation direction. In FIG. 13, the outer periphery of the cavity 9 is indicated by dashed lines. The IDT electrode 84 includes first and second busbars 84a, 84b, a plurality of electrodes 84c as first electrode fingers, and a plurality of electrodes 84d as second electrode fingers. The plurality of electrodes 84c is connected to the first busbar 84a. The plurality of electrodes 84d is connected to the second busbar 84b. The plurality of electrodes 84c and the plurality of electrodes 84d interdigitate with each other.

In the acoustic wave device 81, a Lamb wave serving as a plate wave is excited when an alternating-current electric field is applied to the IDT electrode 84 above the cavity 9. Because the reflectors 85, 86 are respectively provided on both sides, resonant characteristics based on the Lamb wave are obtained. In this way, the acoustic wave device according to preferred embodiments of the present invention can be configured to use a plate wave.

Figure 17:
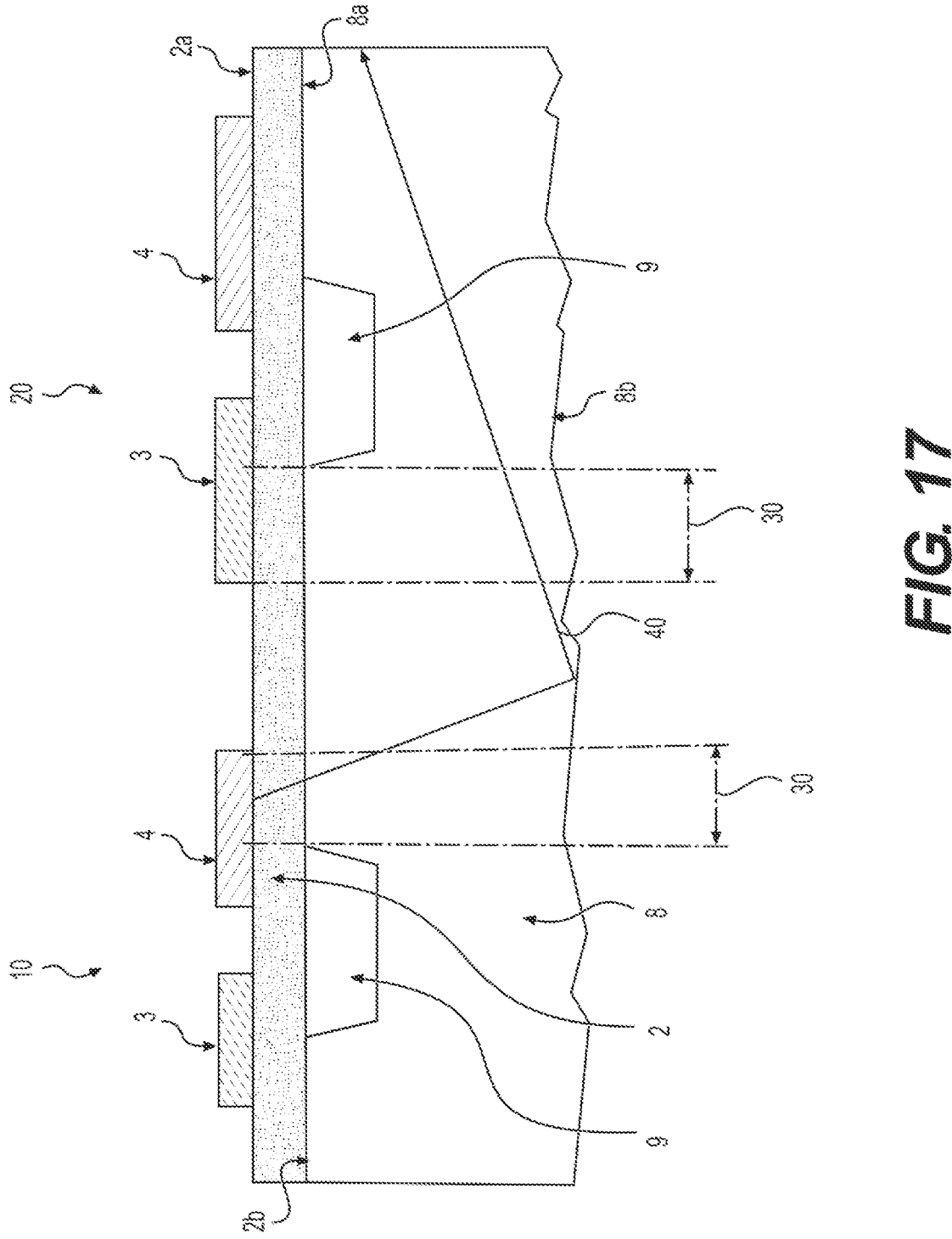
FIG. 17 is a cross-sectional view of an acoustic wave device including a bottom surface that is rougher than a surface of a piezoelectric layer with first and second electrodes.

FIG. 17 shows an acoustic wave device 1 that includes a support substrate 8, a piezoelectric layer 2 on the support substrate 8, and first and second electrodes 3, 4 provided on the piezoelectric layer 2. The support substrate 8 can include a top surface 8a and a bottom surface 8b, and the piezoelectric layer 2 can include a first major surface 2a and a second major surface 2b. The first and the second electrodes 3, 4 can be on the first major surface 2a of the piezoelectric layer 2, and the piezoelectric layer 2 can be on the top surface 8a of the support substrate 8. As described above, the first and second electrodes 3, 4 can also be provided on the second major surface 2b in an alternative aspect. The surface roughness of the bottom surface 8b can be greater than the surface roughness of the first major surface 2b. A different voltage potential can be applied to the first and the second electrodes 3, 4. A cavity 9 is provided between the support substrate 8 and the piezoelectric layer 2, and at least a portion of each of the first and the second electrodes 3, 4 overlaps the cavity 9 when viewed in a lamination direction of the support substrate 8 and the piezoelectric layer 2. As shown in FIG. 17, the acoustic wave device 2 can include first and second resonators 10, 20, with each of the first and the second resonators 10, 20 including a cavity 9 and first and second electrodes 3, 4 on the piezoelectric layer 2 overlapping the corresponding cavity 9.

The first and the second electrodes 3, 4 are provided on the first major surface 2a of the piezoelectric layer 2 and, as shown in FIG. 17, can define two pairs of electrodes, with the first pair of electrodes included in the first resonator 10 and with the second pair of electrodes included in the second resonator 20. Only a portion of the first and the second electrodes 3, 4 are shown in FIG. 17, and the first and the second electrodes 3, 4 can include a larger structure, including, for example, an interdigital transducer (IDT) electrode. The first electrode 3 can include a first comb electrode including a first busbar and a plurality of first electrode fingers of which proximal ends are connected to the first busbar, and the second electrode 4 can include a second comb electrode including a second busbar and a plurality of second electrode fingers of which proximal ends are connected to the second busbar. The plurality of first electrode fingers and the plurality of second electrode fingers can be interdigitated. A single resonator can include one pair of the first and the second comb electrodes. As shown in FIG. 17, a first resonator 10 and a second resonator 20 different from the first resonator 10 are provided on the piezoelectric layer 2 and can each include one pair of the first and the second comb electrodes.

The roughness of the bottom surface 8b of the support substrate 8 (i.e., a major surface of the support substrate 8 on the opposite side of the piezoelectric layer 2) is greater than the roughness of a surface of the piezoelectric layer 2 (i.e., a major surface of the piezoelectric layer 2 on which the first and second electrodes 3, 4 are provided). Although in FIG. 17, the roughness of the overall bottom surface 8b of the support substrate 8 is greater than the roughness of the first major surface 2a of the piezoelectric layer 2, the roughness of at least a portion of the bottom surface 8b of the support substrate 8 can be greater than the roughness of the first major surface 2a of the piezoelectric layer 2. That is, only a portion of the bottom surface 8b can have a roughness greater than the roughness of the first major surface 2a of the piezoelectric layer 2 according to an exemplary aspect.

As shown in FIG. 17, the first resonator 10 is configured to generate a leakage wave 40 in the non-overlapping region 30 where the first and the second electrodes 3, 4 do not overlap with the cavity 9. The bottom surface 8b is configured to scatter the reflected leakage wave 40 so that the electrodes of the first or the second resonator 10 or 20 do not receive the reflected leakage wave 40. Scattering the leakage wave 40 reduces propagation of reflected vibrations to regions of the piezoelectric layer 2 where wires are provided and reduces reflected leakage waves 40 received by electrodes having different potentials, which attenuates the ripple in the pass band.

A roughness can mean the surface roughness Ra defined in JIS80601. Roughness can refer to both the roughness created by non-periodic surfaces as shown in FIG. 17 and the roughness created by the periodic recesses and protrusions in FIG. 21.

Figure 18:
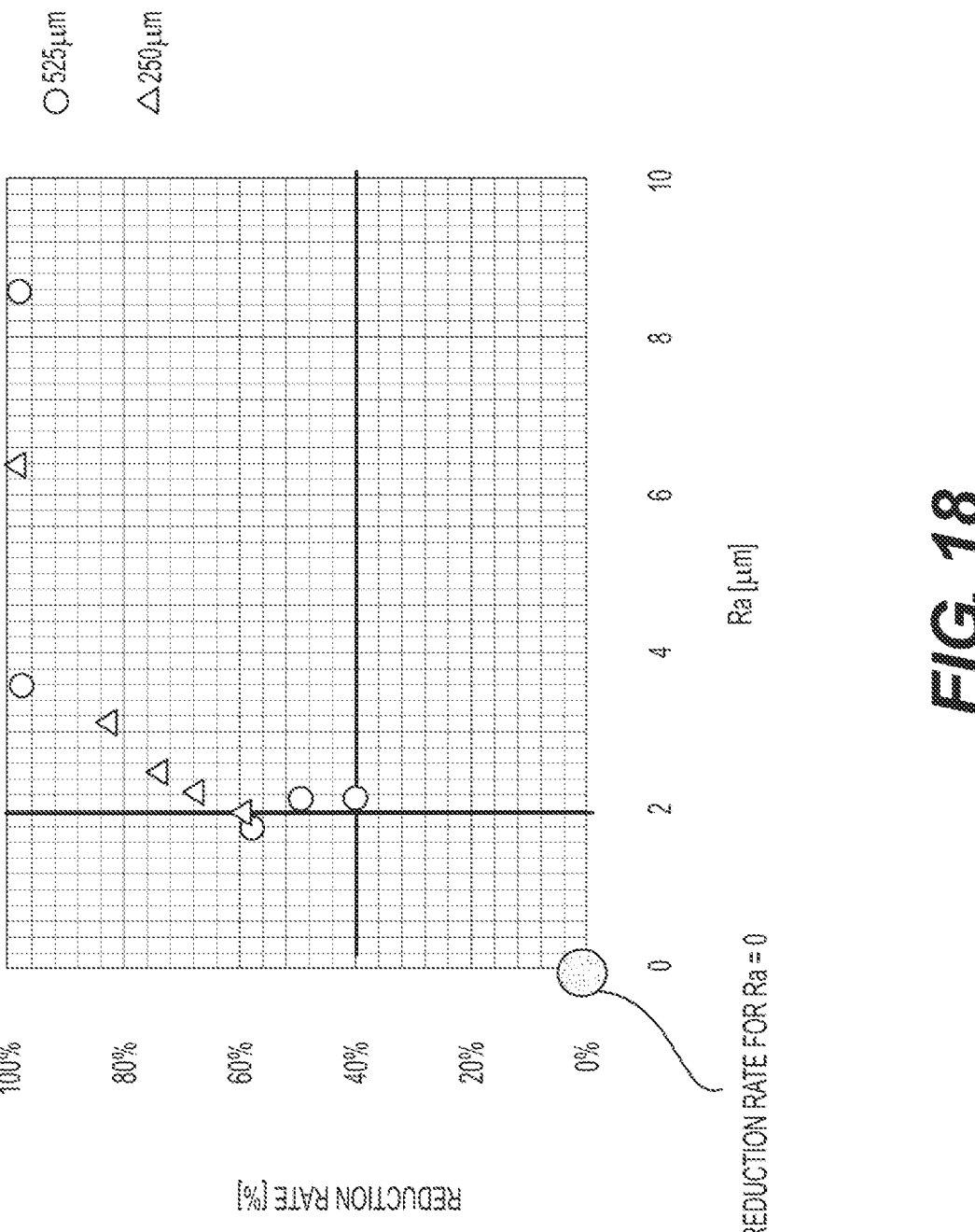
FIG. 18 is a graph showing the relationship with surface roughness and the reduction rate of ripple.

FIG. 18 is a graph that illustrates data showing the relationship between the surface roughness Ra of the bottom surface 8b of the support substrate 8 and a reduction rate of the ripple when the thickness of the support substrate is 525 μm (data points marked with circles ○) or 250 μm (data points marked with triangles Δ). As shown in FIG. 18, when the surface roughness Ra of the bottom surface 8b of the support substrate 8 is greater than 2 μm, the ripple can be reduced by about 40% from the magnitude of the original ripple, and, when the surface roughness Ra is greater than 3.5 μm, the ripple can be reduced by 80%. Furthermore, the ripple can be reduced by almost 100% when the surface roughness Ra is greater than or equal to 3.8 μm.

Figure 19:
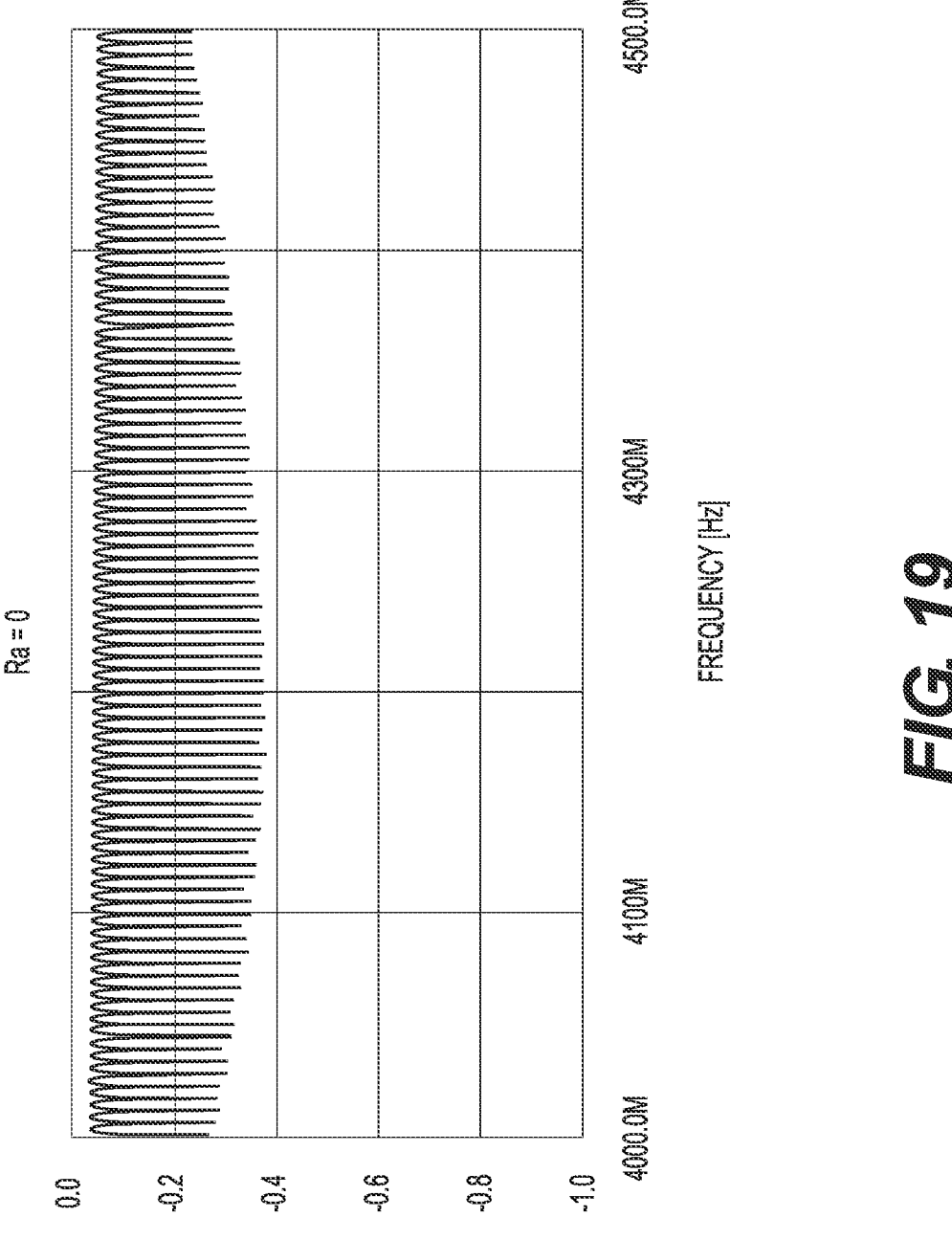
FIGS. 19 and 20 are graphs showing the relationship between the magnitude of the ripple and the frequency.
Figure 20:
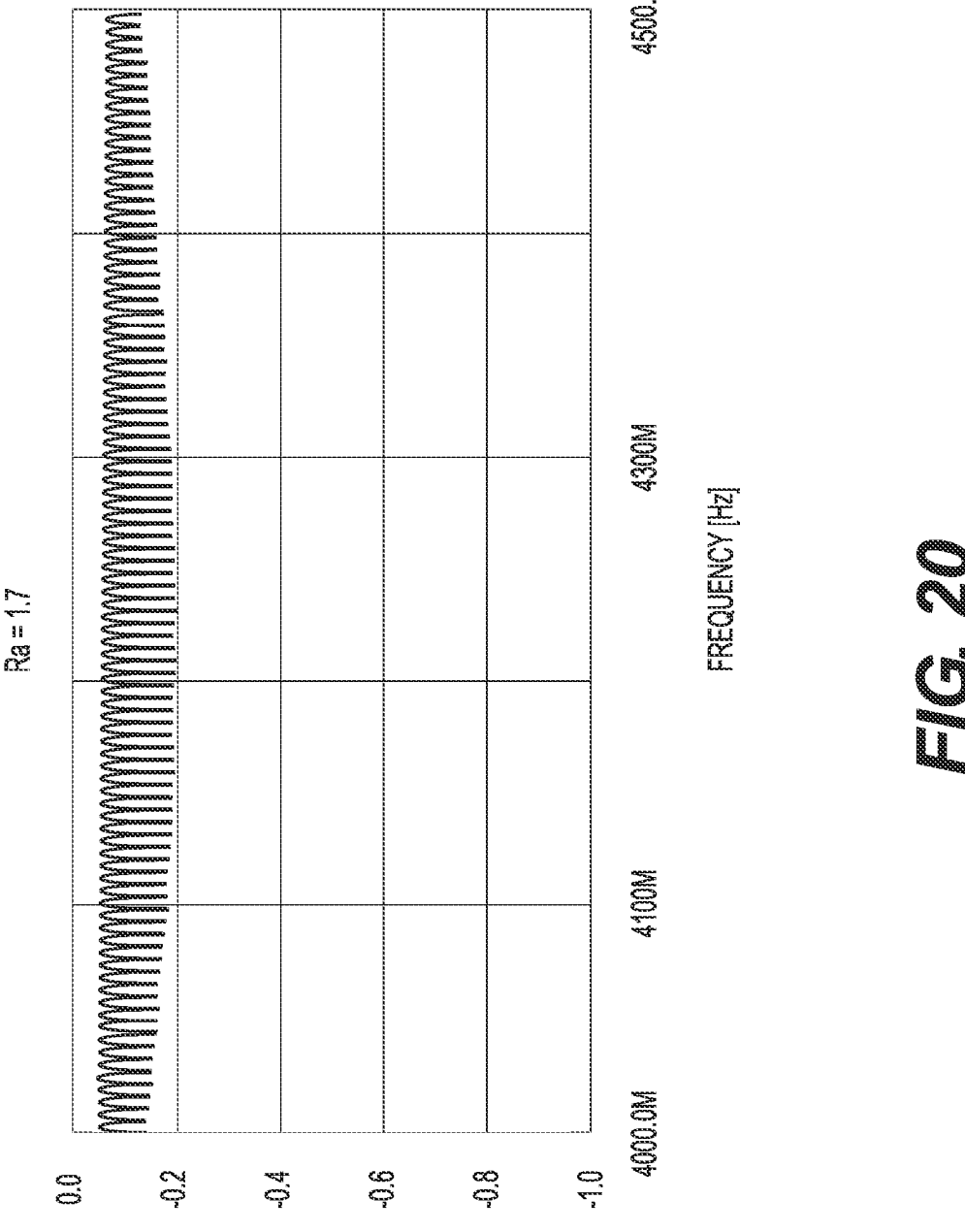

In FIGS. 19 and 20, the magnitude of the ripple is defined as a difference between Max value [dB] and Min value [dB] of parameter S11 in a specific frequency band (for example, 4000 MHz to 4500 MHz) of one resonator. For example, FIG. 20 includes data of parameter S11 when the surface roughness Ra of the bottom surface 8b of the support substrate 8 is 1.7, and FIG. 19 includes data of the parameter S11 when the surface roughness Ra of the bottom surface 8b of the support substrate 8 is zero. As indicated by comparing FIGS. 19 and 20, when the surface roughness Ra of the bottom surface 8b of the support substrate 8 is increased (specifically, when increased as compared to the surface roughness of the surface of the piezoelectric layer 2 of which the surface roughness Ra is brought close to zero without limit), the ripple can be reduced.

The surface roughness of the bottom surface 8b of the support substrate 8 is preferably less than or equal to about 8.5 μm because, when the surface roughness is more than about 8.5 μm, the acoustic wave device 1 can break or can be easily damaged.

Figure 21:
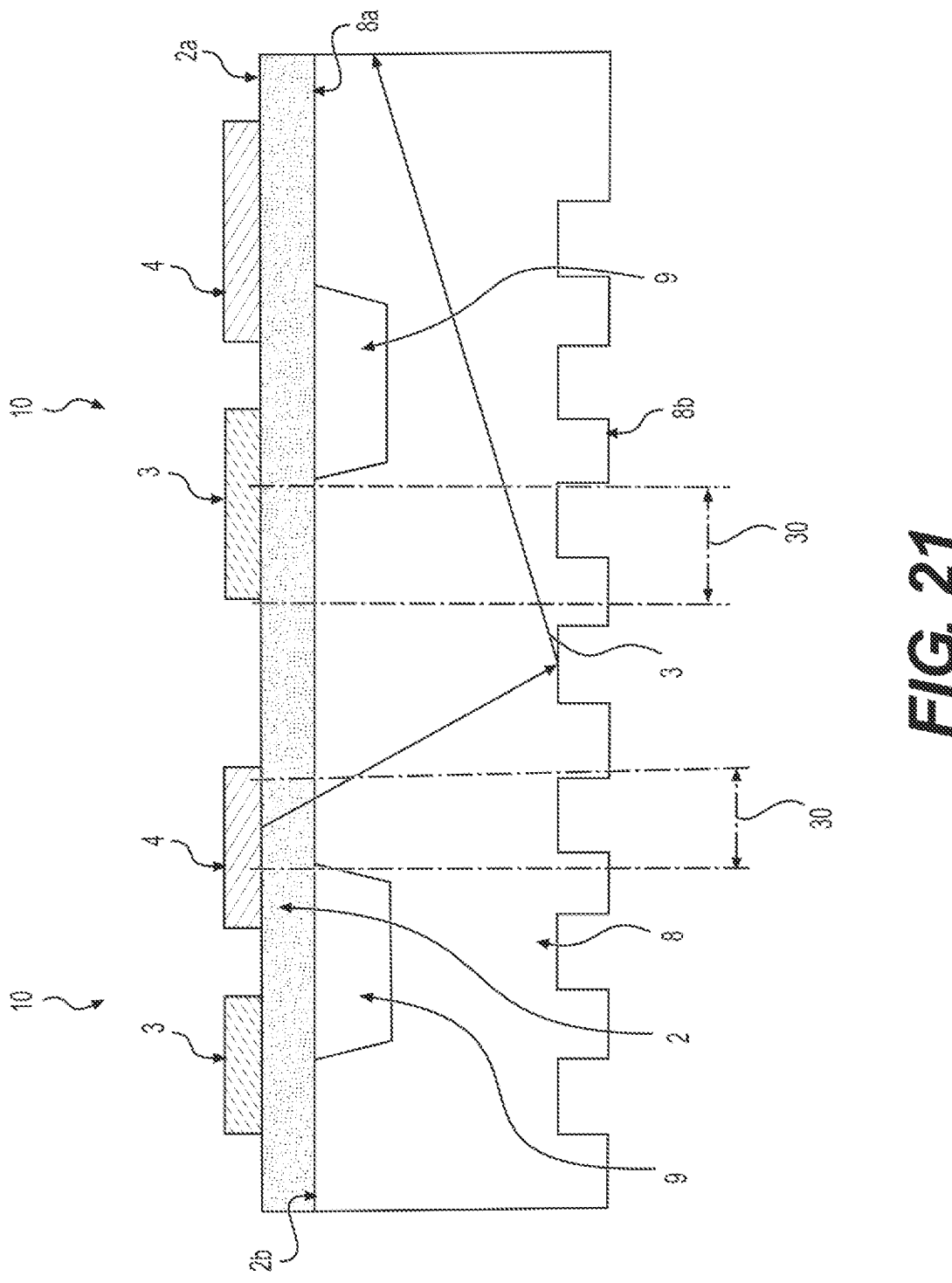
FIG. 21 is cross-sectional view of an acoustic wave device including a bottom surface including recesses and protrusions.

FIG. 21 shows an acoustic wave device 1 similar to FIG. 17, but the bottom surface 8b of the support substrate 8 in FIG. 1 is roughened by periodic recesses and protrusions. The bottom surface 8b in FIG. 21 is configured to scatter the reflected leakage wave 40 so that the electrodes of the first or the second resonator 10 or 20 do not receive the reflected leakage wave 40.

FIG. 22 is a view showing a state of scattering of wave vibrations when the bottom surface 8b of the support substrate 8 (the support substrate 8 can include, for example, Si) is not roughened at all, and FIG. 23 is a view showing a state of scattering of wave vibrations when the bottom surface 8b of the support substrate 8 is periodically roughened. As shown in FIG. 23, a leakage wave can be scattered even with periodic roughness.

Figure 24:
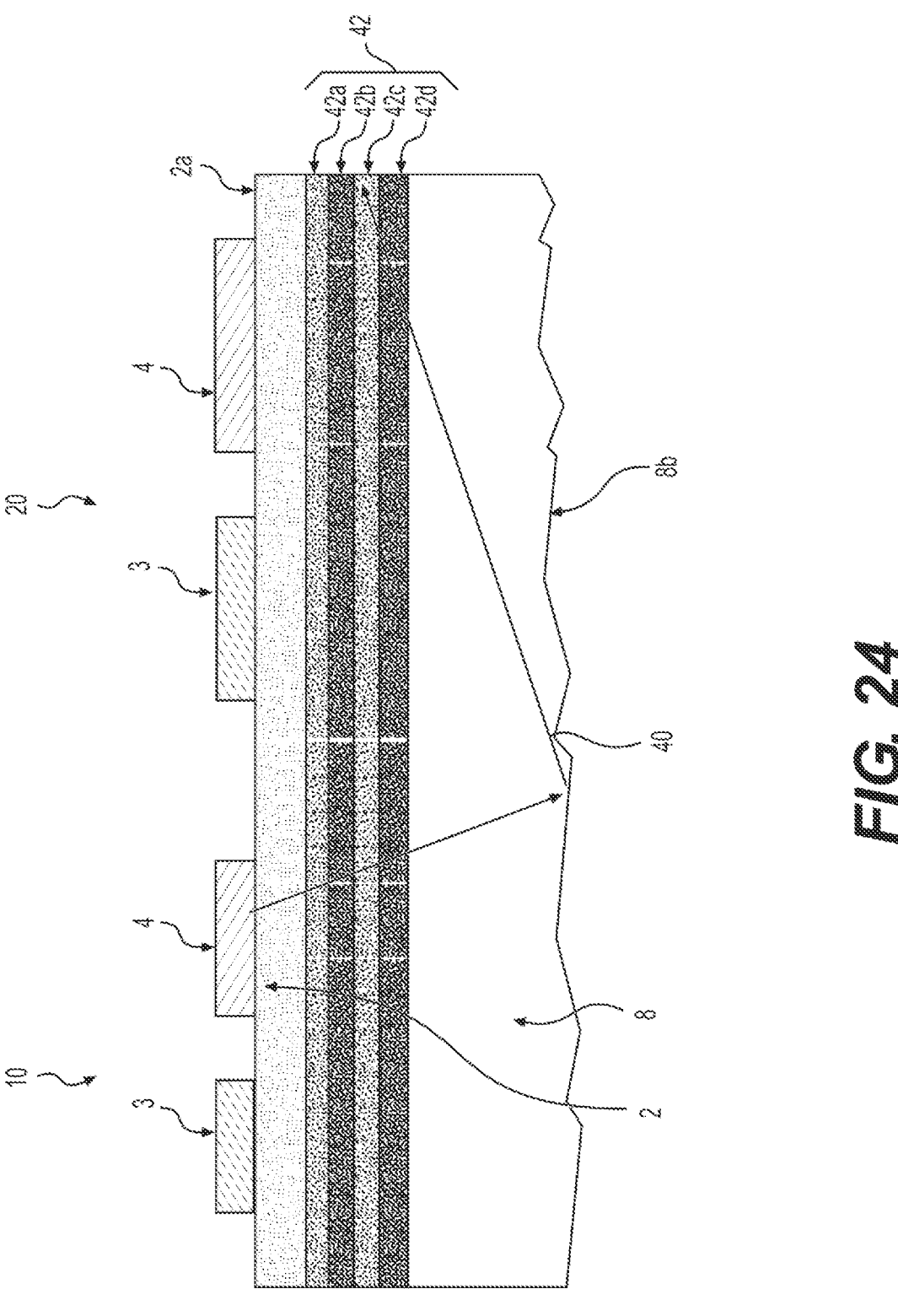
FIG. 24 is a cross-sectional view of an acoustic wave device including an acoustic reflection layer.

FIG. 24 show an acoustic wave device 41 including, instead of cavities 9, an acoustic reflection layer 42 including one or more low acoustic impedance layers 42a, 42c and one or more high acoustic impedance layers 42b, 42d. The acoustic reflection layer 42 can be between a support substrate 8 and a piezoelectric layer 2, instead of providing a cavity 9. The low acoustic impedance layer 42a, 42c is a layer having a lower acoustic impedance than the piezoelectric layer 2, and the high acoustic impedance layer 42b, 42d is a layer having a higher acoustic impedance than the piezoelectric layer 2. The acoustic wave device 41 can include a first and second resonators 10, 20, each including first and second electrodes 3, 4. The first and the second resonators 10, 20 can generate a leakage wave 40. The bottom surface 8b of the acoustic wave device 41 can scatter the reflected leakage wave 40 so that the electrodes of the first or the second resonator 10 or 20 do not receive the reflected leakage wave 40.

In general, it is noted that each of the exemplary embodiments described herein is illustrative and that partial substitutions or combinations of configurations are possible among different embodiments as would be appreciated to one skilled in the art. While exemplary embodiments of the present invention have been described above, it is to be understood that variations and modifications will be apparent to those skilled in the art without departing from the scope and spirit of the present invention.

What is claimed:

1. An acoustic wave device comprising:
   a support substrate;
   a piezoelectric layer on the support substrate;
   a first electrode and a second electrode on the piezoelectric layer in a lamination direction of the support substrate and the piezoelectric layer, the first second electrodes extending in a first direction that intersects with the lamination direction; and
   a space defining either a cavity in the support substrate or an air gap between the support substrate and the piezoelectric layer,
   wherein at least a portion of each of the first and second electrodes overlaps the space in a plan view of the piezoelectric layer, and
   wherein a major surface of the support substrate that is opposite the piezoelectric layer has a first roughness that is greater than a second roughness of a major surface of the piezoelectric layer on which the first and second electrodes are disposed.

2. The acoustic wave device according to claim 1, wherein the first roughness is greater than or equal to 2 μm in surface roughness (Ra).

3. The acoustic wave device according to claim 1, wherein the first roughness is greater than or equal to 3.5 μm in surface roughness (Ra).

4. The acoustic wave device according to claim 1, wherein the first roughness is greater than or equal to about 3.8 μm in surface roughness (Ra).

5. The acoustic wave device according to claim 1, wherein the first roughness is less than or equal to about 8.5 μm in surface roughness (Ra).

6. The acoustic wave device according to claim 1, wherein the major surface of the support substrate periodic recesses and protrusions to form the first roughness.

7. The acoustic wave device according to claim 1, wherein the piezoelectric layer includes lithium niobate or lithium tantalate, and the first and second electrodes are configured to excite a bulk wave in a thickness-shear mode in the piezoelectric layer in response to a voltage signal applied to the first and second electrodes.

8. The acoustic wave device according to claim 1, further comprising:
   a first busbar extending in the first direction; and
   a second busbar extending in the first direction,
   wherein:

the piezoelectric layer includes lithium niobate or lithium tantalate, the first electrode is included in a plurality of first electrodes arranged in the first direction and connected to the first busbar, the second electrode is included in a plurality of second electrodes arranged in the first direction and connected to the second busbar, and $d/p \le 0.5$, where d is a thickness of the piezoelectric layer and p is a distance between a center of the first electrode and a center of the second electrode.

9. The acoustic wave device according to claim 8, wherein one second electrode of the plurality of second electrodes is between adjacent first electrodes among the plurality of first electrodes.

10. The acoustic wave device according to claim 1, further comprising:

a first busbar extending in the first direction; and a second busbar extending in the first direction, wherein:

the first electrode is included in a plurality of first electrodes arranged in the first direction and connected to the first busbar, the second electrode is included a plurality of second electrodes arranged in the first direction and connected to the second busbar, and the plurality of first electrodes and the plurality of second electrodes are configured to excite a plate wave in the piezoelectric layer in response to a voltage signal applied to the plurality of first electrodes and the plurality of second electrodes.

11. The acoustic wave device according to claim 1, wherein the first electrode is included in a first resonator, and the second electrode is included in a second resonator different from the first resonator, and wherein the first and the second resonators are included in a ladder filter.

12. The acoustic wave device according to claim 11, wherein the first resonator is a series arm resonator, and the second resonator is a parallel arm resonator.

13. The acoustic wave device according to claim 1, wherein a potential difference is applied to the first and the second electrodes.

14. An acoustic wave device comprising:

a support substrate including first and second surfaces that oppose each other;

a piezoelectric layer on the first surface of the support substrate and including first and surfaces that oppose each other; and first and second resonators that each include first and second electrodes on the first surface of the piezoelectric layer, wherein, in each of the first and second resonators, a bulk wave in a first thickness-shear mode is enclosed in the piezoelectric layer by one of:

a space defining a cavity in the support substrate or an air gap between the support substrate and the piezoelectric layer; or an acoustic reflection layer that includes one or more low acoustic impedance layers and one or more high acoustic impedance layers between the support substrate and the piezoelectric layer, and wherein the second surface of the support substrate has a first roughness that is greater than a second roughness of the first surface of the piezoelectric layer.

15. The acoustic wave device according to claim 14, wherein the first roughness is greater than or equal to 2 μm in surface roughness (Ra).

16. The acoustic wave device according to claim 14, wherein the first roughness is greater than or equal to 3.5 μm in surface roughness (Ra).

17. The acoustic wave device according to claim 14, wherein the first roughness is less than or equal to 8.5 μm in surface roughness (Ra).

18. The acoustic wave device according to claim 14, wherein the second surface of the support substrate includes periodic recesses and protrusions to form the first roughness.

19. The acoustic wave device according to claim 14, wherein the piezoelectric layer includes lithium niobate or lithium tantalate, and the first and second electrodes are configured to excite a bulk wave in a thickness-shear mode in the piezoelectric layer in response to a voltage signal applied to the first and second electrodes.

20. An acoustic wave device comprising:

a support substrate;

a piezoelectric layer on the support substrate and extending in a first direction of the support substrate;

an acoustic reflection layer that is between the support substrate and the piezoelectric layer and that includes one or more low acoustic impedance layers and one or more high acoustic impedance layers; and a first electrode and a second electrode on the piezoelectric layer that oppose each other and that extend in a direction that intersects with the first direction, wherein at least a portion of each of the first and the second electrodes overlaps the acoustic reflection layer in a plan view of the piezoelectric layer, and wherein a major surface of the support substrate that is opposite the piezoelectric layer has a first roughness that is greater than a second roughness of a major surface of the piezoelectric layer on which the first and second electrodes are disposed.

* * * * *